(12) United States Patent
Kobayashi

(10) Patent No.: US 7,907,136 B2
(45) Date of Patent: Mar. 15, 2011

(54) VOLTAGE GENERATION CIRCUIT

(75) Inventor: Hironori Kobayashi, Asahi-mura (JP)

(73) Assignee: Seiko Epson Corporation, Tokyo (JP)

( * ) Notice: Subject to any disclaimer, the term of this patent is extended or adjusted under 35 U.S.C. 154(b) by 1351 days.

(21) Appl. No.: 11/416,167

(22) Filed: May 3, 2006

(65) Prior Publication Data

US 2006/0267639 A1  Nov. 30, 2006

(30) Foreign Application Priority Data

May 16, 2005  (JP) .................................. 2005-142780

(51) Int. Cl.
*G09G 5/00* (2006.01)
(52) U.S. Cl. .......................... 345/208; 345/690; 345/100
(58) Field of Classification Search .................. 345/208, 345/690, 100, 55
See application file for complete search history.

(56) References Cited

U.S. PATENT DOCUMENTS

| | | | | |
|---|---|---|---|---|
| 6,970,152 | B1 * | 11/2005 | Bell et al. ....................... | 345/100 |
| 2005/0117402 | A1 * | 6/2005 | Kim .......................... | 365/189.05 |
| 2007/0257942 | A1 * | 11/2007 | Kudo et al. ................... | 345/690 |

FOREIGN PATENT DOCUMENTS

JP  A 2003-22063  1/2003

* cited by examiner

*Primary Examiner* — Amr Awad
*Assistant Examiner* — Leonid Shapiro
(74) *Attorney, Agent, or Firm* — Oliff & Berridge PLC

(57) ABSTRACT

A voltage generation circuit includes a voltage divider circuit which generates first to Mth (M is an integer of two or more) divided voltages using a first power supply voltage and a second power supply voltage lower than the first power supply voltage and outputs the generated first to Mth divided voltages, and first to Mth impedance conversion circuits which perform impedance conversion of the first to Mth divided voltages, each of the first to Kth (K<M) impedance conversion circuits and the Lth (K<L<M) to Mth impedance conversion circuits including an operational amplifier of a first type, which is a rail-to-rail type, of which an operational range is set in a range between the first power supply voltage and the second power supply voltage, and each of the (K+1)th to (L−1)th impedance conversion circuits including an operational amplifier of a second type of which an operational range is set in a range between a third voltage which is lower than the first power supply voltage and a fourth voltage which is lower than the first power supply voltage and higher than the second power supply voltage.

16 Claims, 21 Drawing Sheets

REFERENCE VOLTAGE
GENERATION CIRCUIT

VOLTAGE GENERATION CIRCUIT

Japanese Patent Application No. 2005-142780 filed on May 16, 2005, is hereby incorporated by reference in its entirety.

BACKGROUND OF THE INVENTION

The present invention relates to a voltage generation circuit.

As a liquid crystal panel (electro-optical device) used for an electronic instrument such as a portable telephone, a simple matrix type liquid crystal panel and an active matrix type liquid crystal panel using a switching device such as a thin film transistor (hereinafter abbreviated as "TFT") are known.

The simple matrix type liquid crystal panel allows power consumption to be easily reduced in comparison with the active matrix type liquid crystal panel. However, the simple matrix type liquid crystal panel has disadvantages in that it is difficult to increase the number of colors and to display a video image. The active matrix type liquid crystal panel is suitable for increasing the number of colors and displaying a video image. However, the active matrix type liquid crystal panel has a disadvantage in that it is difficult to reduce power consumption.

In recent years, an increase in the number of colors and a video image display have been demanded for a portable electronic instrument such as a portable telephone in order to provide a high-quality image. Therefore, the active matrix type liquid crystal panel has been increasingly used instead of the simple matrix type liquid crystal panel (JP-A-2003-22063).

In the active matrix type liquid crystal panel, it is desirable to provide an operational amplifier which functions as an output buffer in a data line driver circuit which drives data lines of the liquid crystal panel. Along with an increase in image quality, resolution, and the number of grayscales of a display panel, it is necessary to reduce power consumption of the data line driver circuit.

SUMMARY

One aspect of the invention relates to a voltage generation circuit comprising:

a voltage divider circuit which generates first to Mth (M is an integer of two or more) divided voltages using a first power supply which supplies a first power supply voltage and a second power supply which supplies a second power supply voltage lower than the first power supply voltage, and outputs the generated first to Mth divided voltages; and first to Mth impedance conversion circuits which perform impedance conversion of the first to Mth divided voltages, each of the first to Pth (1<P<M, P is an integer) impedance conversion circuits and the Qth (P<Q<M, Q is an integer) to Mth impedance conversion circuits including an operational amplifier of a first type, which is a rail-to-rail type, of which an operational range is set in a range between the first power supply voltage and the second power supply voltage, and each of the (P+1)th to (Q−1)th impedance conversion circuits including an operational amplifier of a second type of which an operational range is set in a range between a third voltage which is lower than the first power supply voltage and a fourth voltage which is lower than the first power supply voltage and higher than the second power supply voltage.

DETAILED DESCRIPTION OF THE EMBODIMENT

Figure 1:
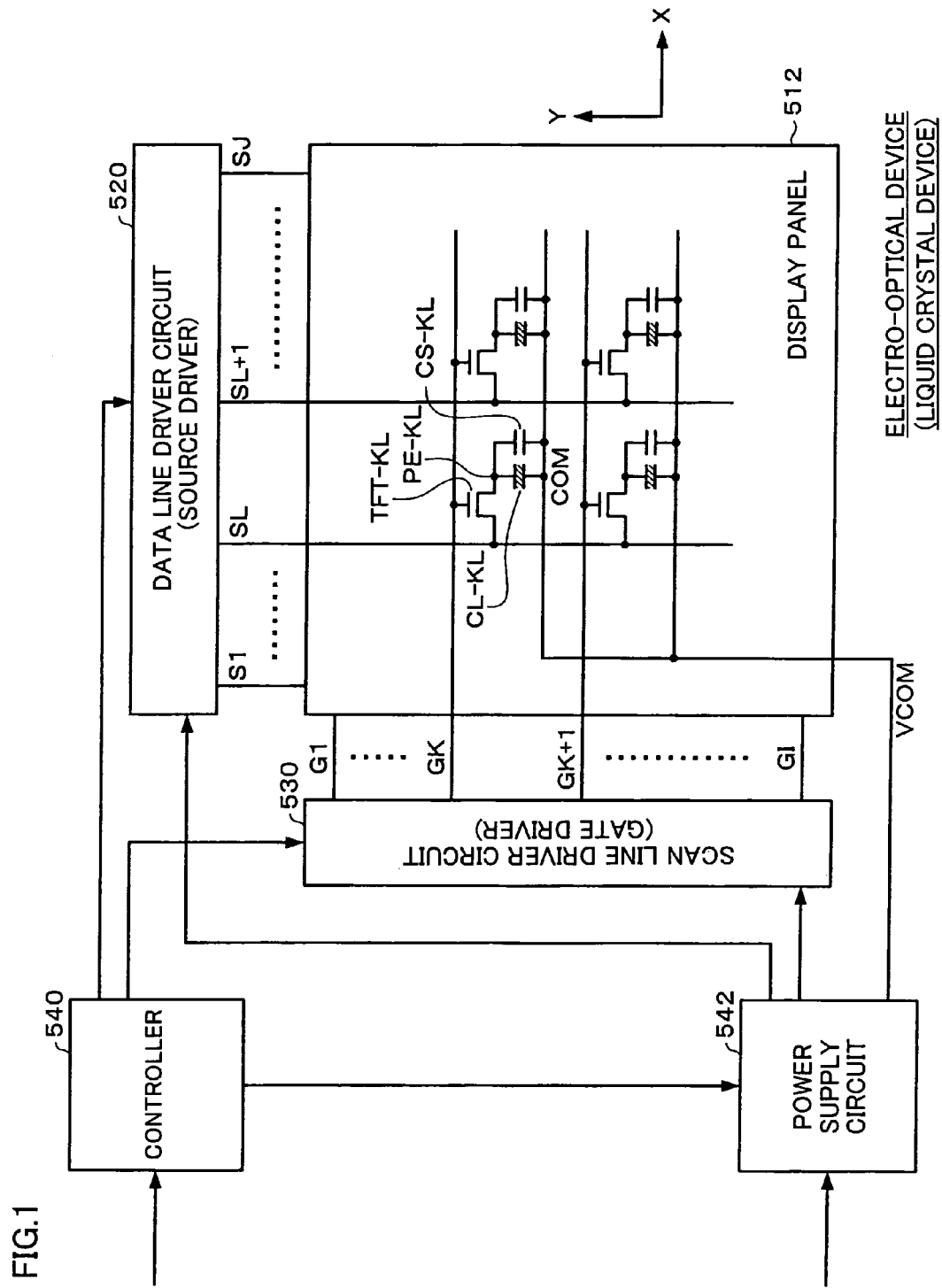
FIG. 1 is a block diagram showing a configuration example of an electro-optical device (liquid crystal device).

The invention may provide a voltage generation circuit which can flexibly deal with the display characteristics of various display panels and exhibits low power consumption.

One embodiment of the invention relates to a voltage generation circuit comprising:

a voltage divider circuit which generates first to Mth (M is an integer of two or more) divided voltages using a first power supply which supplies a first power supply voltage and a second power supply which supplies a second power supply voltage lower than the first power supply voltage, and outputs the generated first to Mth divided voltages; and first to Mth impedance conversion circuits which perform impedance conversion of the first to Mth divided voltages, each of the first to Pth (1<P<M, P is an integer) impedance conversion circuits and the Qth (P<Q<M, Q is an integer) to Mth impedance conversion circuits including an operational amplifier of a first type, which is a rail-to-rail type, of which an operational range is set in a range between the first power supply voltage and the second power supply voltage, and each of the (P+1)th to (Q−1)th impedance conversion circuits including an operational amplifier of a second type of which an operational range is set in a range between a third voltage which is lower than the first power supply voltage and a fourth voltage which is lower than the first power supply voltage and higher than the second power supply voltage.

Therefore, when applying this embodiment to a display panel, optimum grayscale voltages for the display characteristics of the panel can be supplied at a low power consumption in comparison with the case of using only the operational amplifiers of the first type.

In this embodiment, each of the second to Pth impedance conversion circuits and the Qth to (M−1)th impedance conversion circuits may further include the operational amplifier of the second type; and the operational amplifier of the first type and the operational amplifier of the second type provided in each of the second to Pth impedance conversion circuits and the Qth to (M−1)th impedance conversion circuits may be exclusively selected to output the voltage subjected to impedance conversion.

According to this embodiment, the second to Pth impedance conversion circuits and the Qth to (M−1)th impedance conversion circuits can exclusively select the operational amplifier of the first type and the operational amplifier of the second type having different operational ranges. Therefore, when applying this embodiment to a display panel, optimum grayscale voltages can be supplied to various panels at a lower power consumption.

In this embodiment, the operational amplifier of the first type and the operational amplifier of the second type provided in each of the second to Pth impedance conversion circuits and the Qth to (M−1)th impedance conversion circuits may be exclusively selected to output the voltage subjected to impedance conversion based on a value set in an initialization register for setting selection/unselection of the operational amplifier of the first type and the operational amplifier of the second type.

This allows the information of selection/unselection of the operational amplifier of the first type and the operational amplifier of the second type to be arbitrarily set and stored. For example, when applying this embodiment to a display panel, since the user can store optimum setting information for the display characteristics of the panel in the initialization register, the voltage generation circuit can be always used at an optimum setting for the panel.

In this embodiment, a bias current transistor may be turned ON in the selected operational amplifier of the operational amplifier of the first type and the operational amplifier of the second type provided in each of the second to Pth impedance conversion circuits and the Qth to (M−1)th impedance conversion circuits, and a bias current transistor may be turned OFF in the unselected operational amplifier.

This prevents unnecessary current consumption by the unselected operational amplifier.

In this embodiment, each of the operational amplifier of the first type and the operational amplifier of the second type may include: a first conductivity type differential amplifier circuit (100) which includes a first conductivity type first differential transistor pair (PT1, PT2), sources of the transistors being connected with the other end of a first current source (CS1) to which the first power supply voltage (VDD) is supplied at one end and an input signal (Vin) and an output signal (Vout) being respectively input to gates of the transistors, and a first current mirror circuit (CM1) which generates drain currents of the transistors of the first differential transistor pair; a second conductivity type differential amplifier circuit (110) which includes a second conductivity type second differential transistor pair (NT3, NT4), sources of the transistors being connected with the other end of a second current source (CS2) to which the second power supply voltage (VSS) is supplied at one end and the input signal and the output signal being respectively input to gates of the transistors, and a second current mirror circuit (CM2) which generates drain currents of the transistors of the second differential transistor pair; and an output circuit (120) which includes a second conductivity type first driver transistor (NTO1) of which gate voltage is controlled based on voltage of a first output node (ND1) which is one of drains of the transistors of the first differential transistor pair, and a first conductivity type second driver transistor (PTO1) of which a drain is connected with a drain of the first driver transistor (NTO1) and of which gate voltage is controlled based on voltage of a second output node (ND2) which is one of drains of the transistors of the second differential transistor pair, and outputs voltage of the drain of the first driver transistor as the output signal (Vout).

In this embodiment, the operational amplifier includes the first conductivity type differential amplifier circuit and the second conductivity type differential amplifier circuit, and the input signal and the output signal are input to the differential transistor pairs of different conductivity types. The transistors of each differential transistor pair are connected with the current source, and the drain current of each transistor is generated by the current mirror circuit, whereby the output circuit can output the output signal based on the voltage of the output node of each differential amplifier circuit.

In this embodiment, each of the operational amplifier of the first type and the operational amplifier of the second type may further include a first switch which electrically connects the gate of the transistor (NT3) to which the input signal (Vin) is input at the gate with the gate of the transistor (NT4) to which the output signal (Vout) is input at the gate; and the first switch may be turned ON in the unselected operational amplifier of the operational amplifier of the first type and the operational amplifier of the second type, and the first switch may be turned OFF in the selected operational amplifier.

This prevents the output voltage of the impedance conversion circuit from being affected by the output from the unselected operational amplifier.

In this embodiment, each of the operational amplifier of the first type and the operational amplifier of the second type may further include: a second switch which electrically connects the first output node (ND1) and the second power supply; and a third switch which electrically connects the second output node (ND2) and the first power supply; and the second and third switches may be turned ON in the unselected operational amplifier of the operational amplifier of the first type and the operational amplifier of the second type, and the second and third switches may be turned OFF in the selected operational amplifier.

This prevents the output voltage of the impedance conversion circuit from being affected by the output from the unselected operational amplifier.

In this embodiment, each of the operational amplifier of the first type and the operational amplifier of the second type may further include a fourth switch which electrically connects the gate of the transistor (NT4) to which the input signal is input at the gate with an output section from which the output signal (Vout) is output; and the fourth switch may be turned OFF in the unselected operational amplifier of the operational amplifier of the first type and the operational amplifier of the second type, and the fourth switch may be turned ON in the selected operational amplifier.

This prevents the output voltage of the impedance conversion circuit from being affected by the output from the unselected operational amplifier.

In this embodiment, each of the operational amplifier of the first type and the operational amplifier of the second type may further include: a fifth switch which electrically connects a middle node between the second driver transistor (PTO1) and the first driver transistor (NTO1) and the drain of the second driver transistor (PTO1); and a sixth switch which electrically connects the drain of the first driver transistor (NTO1) and the middle node; and the fifth and sixth switches may be turned OFF in the unselected operational amplifier of the operational amplifier of the first type and the operational amplifier of the second type, and the fifth and sixth switches may be turned ON in the selected operational amplifier.

This prevents the output voltage of the impedance conversion circuit from being affected by the output from the unselected operational amplifier.

In this embodiment, each of the operational amplifier of the first type and the operational amplifier of the second type may further include an output enable switch which electrically connects a middle node between the second driver transistor (PTO1) and the first driver transistor (NTO1) and an output section from which the output signal (Vout) is output; and the output enable switch may be turned OFF in the unselected operational amplifier of the operational amplifier of the first type and the operational amplifier of the second type, and the output enable switch may be turned ON in the selected operational amplifier.

This prevents the output voltage of the impedance conversion circuit from being affected by the output from the unselected operational amplifier.

In this embodiment, the operational amplifier of the first type may further include: a first auxiliary circuit (130) which drives at least one of the first output node (ND1) and a first inversion output node (NXD1) which are the drains of the transistors of the first differential transistor pair based on the input signal (Vin) and the output signal (Vout); and a second auxiliary circuit (140) which drives at least one of the second output node (ND2) and a second inversion output node (NXD2) which are the drains of the transistors of the second differential transistor pair based on the input signal (Vin) and the output signal (Vout).

This enables the gate voltages of the first and second driver transistors of the output circuit to be controlled.

In this embodiment, when an absolute value of a gate-source voltage of the transistor (PT1) of the first differential transistor pair (PT1, PT2) to which the input signal (Vin) is input at the gate is smaller than an absolute value of a threshold voltage of the transistor, the first auxiliary circuit (130) may control the gate voltage of the first driver transistor (NTO1) by driving at least one of the first output node (ND1) and the first inversion output node (NXD1); and, when an absolute value of a gate-source voltage of the transistor (NT3) of the second differential transistor pair (NT3, NT4) to which the input signal (Vin) is input at the gate is smaller than an absolute value of a threshold voltage of the transistor, the second auxiliary circuit (140) may control the gate voltage of the second driver transistor (PTO1) by driving at least one of the second output node (ND2) and the second inversion output node (NXD2).

Therefore, when the input signal in such a range that the first differential transistor pair operates and the second differential transistor pair does not operate is input, the gate voltage of the first driver transistor of the output circuit can be controlled by allowing the first conductivity type differential amplifier circuit to amplify the difference between the input signal and the output signal. On the other hand, since each node of the second conductivity type differential amplifier circuit becomes variable, the gate voltage of the second driver transistor can be controlled by allowing the second auxiliary circuit to drive at least one of the second output node and the second inversion output node of the second conductivity type differential amplifier circuit.

When the input signal in such a range that the second differential transistor pair does not operate and the first differential transistor pair operates is input, the gate voltage of the second driver transistor of the output circuit can be controlled by allowing the second conductivity type differential amplifier circuit to amplify the difference between the input signal and the output signal. On the other hand, since each node of the first conductivity type differential amplifier circuit becomes variable, the gate voltage of the first driver transistor can be controlled by allowing the first auxiliary circuit to drive at least one of the first output node and the first inversion output node of the first conductivity type differential amplifier circuit.

This enables the gate voltages of the first and second driver transistors of the output circuit to be controlled, whereby occurrence of unnecessary shoot-through current caused when the input signal is in the range of the input dead zone can be prevented. Therefore, since the operational amplifier can be formed using the voltage between the high-potential-side power supply voltage and the low-potential-side power supply voltage as the amplitude, the operating voltage can be reduced without decreasing the drive capability, whereby power consumption can be further reduced. This means mounting of a voltage booster circuit and a reduction in voltage of the manufacturing process, whereby cost is reduced.

In this embodiment, the first auxiliary circuit may include: first conductivity type first and second current driver transistors (PA1, PA2), the first power supply voltage (VDD) being supplied to sources of the first and second current driver transistors and drains of the first and second current driver transistors being respectively connected with the first output node (ND1) and the first inversion output node (NXD1); and a first current control circuit (132) which controls gate voltages of the first and second current driver transistors (PA1, PA2) based on the input signal (Vin) and the output signal (Vout); when an absolute value of a gate-source voltage of the transistor (PT1) of the first differential transistor pair (PT1, PT2) to which the input signal (Vin) is input at the gate is smaller than an absolute value of a threshold voltage of the transistor, the first current control circuit (132) may control the gate voltages of the first and second current driver transistors (PA1, PA2) so that at least one of the first output node (ND1) and the first inversion output node (NXD1) is driven.

According to this embodiment, the first output node or the first inversion output node can be driven using a simple configuration by controlling the gate voltages of the first and second current driver transistors. As a result, the gate voltage of the first driver transistor can be controlled using a simple configuration.

Note that another element (e.g. switching device) may be provided between the drain of the first or second current driver transistor and the first output node or first inversion output node.

In this embodiment, the first current control circuit (132) may include: a third current source (CS3) to which the second power supply voltage (VSS) is supplied at one end; a second conductivity type third differential transistor pair (NS5, NS6), sources of the transistors being connected with the other end of the third current source (CS3) and the input signal (Vin) and the output signal (Vout) being respectively input to gates of the transistors; and first conductivity type fifth and sixth current driver transistors (PS5, PS6), the first power supply voltage (VDD) being supplied to sources of the fifth and sixth current driver transistors, drains of the fifth and sixth current driver transistors being respectively connected with the drains of the transistors of the third differential transistor pair (NS5, NS6), and a gate and the drain of each of the fifth and sixth current driver transistors being connected; the drain of the transistor (NS5) of the third differential transistor pair to which the input signal (Vin) is input at the gate may be connected with the gate of the second current driver transistor (PA2); and the drain of the transistor (NS6) of the third differential transistor pair to which the output signal (Vout) is input at the gate may be connected with the gate of the first current driver transistor (PA1).

According to this embodiment, when the input signal in such a range that the first differential transistor pair does not operate is input, the first output node and the first inversion output node can be supplementarily driven by the first and second current driver transistors controlled by the first current control circuit using a simple configuration.

Note that another element (e.g. switching device) may be provided between the source of each transistor of the third differential transistor pair and the third current source, or between the drain of each transistor of the third differential transistor pair and the drain of the fifth or sixth current driver transistor, or between the drain of the transistor of the third differential transistor pair to which the input signal is input at the gate and the gate of the second current driver transistor, or between the drain of the transistor of the third differential transistor pair to which the output signal is input at the gate and the gate of the first current driver transistor.

In this embodiment, the operational amplifier of the first type may further include: a first auxiliary switch which electrically connects the gate of the first current driver transistor (PA1) and the first power supply; and a second auxiliary switch which electrically connects the gate of the second current driver transistor (PA2) and the first power supply; the first and second auxiliary switches may be turned ON when the operational amplifier of the first type is not selected; and the first and second auxiliary switches may be turned OFF when the operational amplifier of the first type is selected.

This prevents the output voltage of the impedance conversion circuit from being affected by the output from the unselected operational amplifier.

In this embodiment, the second auxiliary circuit (140) may include: second conductivity type third and fourth current driver transistors (NA3, NA4), the second power supply voltage (VSS) being supplied to sources of the third and fourth current driver transistors and drains of the third and fourth current driver transistors being respectively connected with the second output node (ND2) and the second inversion output node (NXD2); and a second current control circuit (142) which controls gate voltages of the third and fourth current driver transistors (NA3, NA4) based on the input signal (Vin) and the output signal (Vout); and, when an absolute value of a gate-source voltage of the transistor (NT3) of the second differential transistor pair (NT3, NT4) to which the input signal (Vin) is input at the gate is smaller than an absolute value of a threshold voltage of the transistor, the second current control circuit (142) may control the gate voltages of the third and fourth current driver transistors (NA3, NA4) so that at least one of the second output node (ND2) and the second inversion output node (NXD2) is driven.

According to this embodiment, the second output node or the second inversion output node can be driven using a simple configuration by controlling the gate voltages of the third and fourth current driver transistors. As a result, the gate voltage of the second driver transistor can be controlled using a simple configuration.

Note that another element (e.g. switching device) may be provided between the drain of the third or fourth current driver transistor and the second output node or second inversion output node.

In this embodiment, the second current control circuit (142) may include: a fourth current source (CS4) to which the first power supply voltage (VDD) is supplied at one end; a first conductivity type fourth differential transistor pair (PS7, PS8), sources of the transistors being connected with the other end of the fourth current source (CS4) and the input signal (Vin) and the output signal (Vout) being respectively input to gates of the transistors; and second conductivity type seventh and eighth current driver transistors, the second power supply voltage (VSS) being supplied to sources of the seventh and eighth current driver transistors, drains of the seventh and eighth current driver transistors being respectively connected with the drains of the transistors of the fourth differential transistor pair (PS7, PS8), and a gate and the drain of each of the seventh and eighth current driver transistors being connected; the drain of the transistor (PS7) of the fourth differential transistor pair to which the input signal (Vin) is input at the gate may be connected with the gate of the fourth current driver transistor (NA4); and the drain of the transistor (PS8) of the fourth differential transistor pair to which the output signal (Vout) is input at the gate may be connected with the gate of the third current driver transistor (NA3).

According to this embodiment, when the input signal in such a range that the second differential transistor pair does not operate is input, the second output node and the second inversion output node can be supplementarily driven by the third and fourth current driver transistors controlled by the second current control circuit using a simple configuration.

Note that another element (e.g. switching device) may be provided between the source of each transistor of the fourth differential transistor pair and the fourth current source, or between the drain of each transistor of the fourth differential transistor pair and the drain of the seventh or eighth current driver transistor, or between the drain of the transistor of the fourth differential transistor pair to which the input signal is input at the gate and the gate of the seventh current driver transistor, or between the drain of the transistor of the fourth differential transistor pair to which the output signal is input at the gate and the gate of the eighth current driver transistor.

In this embodiment, the operational amplifier of the first type may further include: a third auxiliary switch which electrically connects the gate of the third current driver transistor (NA3) and the second power supply; and a fourth auxiliary switch which electrically connects the gate of the fourth current driver transistor (NA4) and the second power supply; and the third and fourth auxiliary switches may be turned ON when the operational amplifier of the first type is not selected; and the third and fourth auxiliary switches may be turned OFF when the operational amplifier of the first type is selected.

This prevents the output voltage of the impedance conversion circuit from being affected by the output from the unselected operational amplifier.

In this embodiment, the operational amplifier of the first type may include: a first conductivity type differential amplifier circuit (100) which amplifies a difference between an input signal (Vin) and an output signal (Vout); a second conductivity type differential amplifier circuit (110) which amplifies the difference between the input signal (Vin) and the output signal (Vout); a first auxiliary circuit (130) which drives at least one of a first output node (ND1) and a first inversion output node (NXD1) of the first conductivity type differential amplifier circuit based on the input signal (Vin) and the output signal (Vout); a second auxiliary circuit (140) which drives at least one of a second output node (ND2) and a second inversion output node (NXD2) of the second conductivity type differential amplifier circuit based on the input signal (Vin) and the output signal (Vout); and an output circuit (120) which generates the output signal (Vout) based on voltages of the first and second output nodes (ND1, ND2).

This enables the operational amplifier of the first type to operate in the range between the first power supply voltage and the second power supply voltage.

The embodiments of the invention are described below with reference to the drawings. Note that the embodiments described below do not in any way limit the scope of the invention laid out in the claims. Note that all elements of the embodiments described below should not necessarily be taken as essential requirements for the invention. In the drawings, sections indicated by the same symbols have the same meanings.

1. Electro-optical Device

FIG. 1 shows a configuration example of an electro-optical device (liquid crystal device in a narrow sense) according to one embodiment of the invention. The electro-optical device may be incorporated into various electronic instruments such as a portable telephone, portable information instrument (e.g. PDA), digital camera, projector, portable audio player, mass storage device, video camera, electronic notebook, or global positioning system (GPS).

The electro-optical device shown in FIG. 1 includes a display panel (liquid crystal display (LCD) panel in a narrow sense) 512, a data line driver circuit (source driver in a narrow sense) 520, a scan line driver circuit (gate driver in a narrow sense) 530, a controller 540, and a power supply circuit 542. The electro-optical device need not necessarily include all of these circuit blocks. The electro-optical device may have a configuration in which some of these circuit blocks are omitted.

The display panel 512 (electro-optical device) includes a plurality of scan lines (gate lines in a narrow sense), a plurality of data lines (source lines in a narrow sense), and pixels specified by the scan lines and the data lines. In this case, an active matrix type electro-optical device may be formed by connecting a thin film transistor (TFT; pixel switching device in a broad sense) with the data line and connecting a pixel electrode with the TFT.

In more detail, the display panel 512 is formed by an active matrix substrate (e.g. glass substrate). A plurality of scan lines G1 to GI (I is a positive integer of two or more), arranged in a direction Y shown in FIG. 1 and extending in a direction X, and a plurality of data lines S1 to SJ (J is a positive integer of two or more), arranged in the direction X and extending in the direction Y, are disposed on the active matrix substrate. A pixel is formed at a position corresponding to the intersecting point of the scan line GK ($1 \leq K \leq I$, K is a positive integer) and the data line SL ($1 \leq L \leq J$, L is a positive integer). Each pixel includes a thin film transistor TFT-KL (pixel switching device in a broad sense) and a pixel electrode PE-KL.

A gate electrode of the thin film transistor TFT-KL is connected with the scan line GK, a source electrode of the thin film transistor TFT-KL is connected with the data line SL, and a drain electrode of the thin film transistor TFT-KL is connected with the pixel electrode PE-KL. A liquid crystal capacitor CL-KL (electro-optical substance capacitor) and a storage capacitor CS-KL are formed between the pixel electrode PE-KL and a common electrode COM which faces the pixel electrode PE-KL through a liquid crystal element (electro-optical substance in a broad sense). A liquid crystal is sealed between the active matrix substrate, on which the thin film transistor TFT-KL, the pixel electrode PE-KL, and the like are formed, and a common substrate on which the common electrode COM is formed. The transmissivity of the liquid crystal element changes corresponding to the voltage applied between the pixel electrode PE-KL and the common electrode COM.

A voltage VCOM (first and second common voltages) applied to the common electrode COM is generated by the power supply circuit 542. The common electrode COM may be formed in a stripe pattern corresponding to each scan line instead of forming the common electrode COM over the common substrate.

The data line driver circuit 520 drives the data lines S1 to SJ of the display panel 512 based on image data. The scan line driver circuit 530 sequentially scans the scan lines G1 to GI of the display panel 512.

The controller 540 controls the data line driver circuit 520, the scan line driver circuit 530, and the power supply circuit 542 according to information set by a host such as a central processing unit (hereinafter abbreviated as "CPU") (not shown).

In more detail, the controller 540 sets an operation mode or supplies a vertical synchronization signal or a horizontal synchronization signal generated therein to the data line driver circuit 520 and the scan line driver circuit 530, and controls the polarity reversal timing of the voltage VCOM of the common electrode COM for the power supply circuit 542, for example.

The power supply circuit 542 generates voltages necessary for driving the display panel 512 and the voltage VCOM of the common electrode COM based on a reference voltage supplied from the outside.

In FIG. 1, the electro-optical device includes the controller 540. Note that the controller 540 may be provided outside the electro-optical device. Or, the host may be included in the electro-optical device together with the controller 540.

At least one of the scan line driver circuit 530, the controller 540, and the power supply circuit 542 may be provided in the data line driver circuit 520. At least one or all of the data line driver circuit 520, the scan line driver circuit 530, the controller 540, and the power supply circuit 542 may be formed on the display panel 512.

The liquid crystal element deteriorates when a direct-current voltage is applied to the liquid crystal element for a long time. Therefore, it is necessary to reverse the polarity of voltage applied to the liquid crystal element in units of specific periods. As such a drive method, a frame inversion drive, scan (gate) line inversion drive, data (source) line inversion drive, dot inversion drive, and the like can be given.

In the scan line inversion drive, the polarity of voltage applied to the liquid crystal element is reversed in units of scan periods (in units of one or more scan lines). For example, a positive voltage is applied to the liquid crystal element in the Nth scan period (select period of Nth scan line), a negative voltage is applied to the liquid crystal element in the (N+1)th scan period, and a positive voltage is applied to the liquid crystal element in the (N+2)th scan period. In the next frame, a negative voltage is applied to the liquid crystal element in the Nth scan period, a positive voltage is applied to the liquid crystal element in the (N+1)th scan period, and a negative voltage is applied to the liquid crystal element in the (N+2)th scan period.

In the scan line inversion drive, the polarity of the voltage VCOM (hereinafter called "common voltage") of the common electrode COM is reversed in units of scan periods. A voltage necessary for driving the display panel can be reduced by reversing the polarity of the common voltage VCOM. This enables the voltage of the driver circuit to be reduced, whereby the manufacturing process of the driver circuit can be simplified, and cost can be reduced.

2. Data Line Driver Circuit

Figure 2:
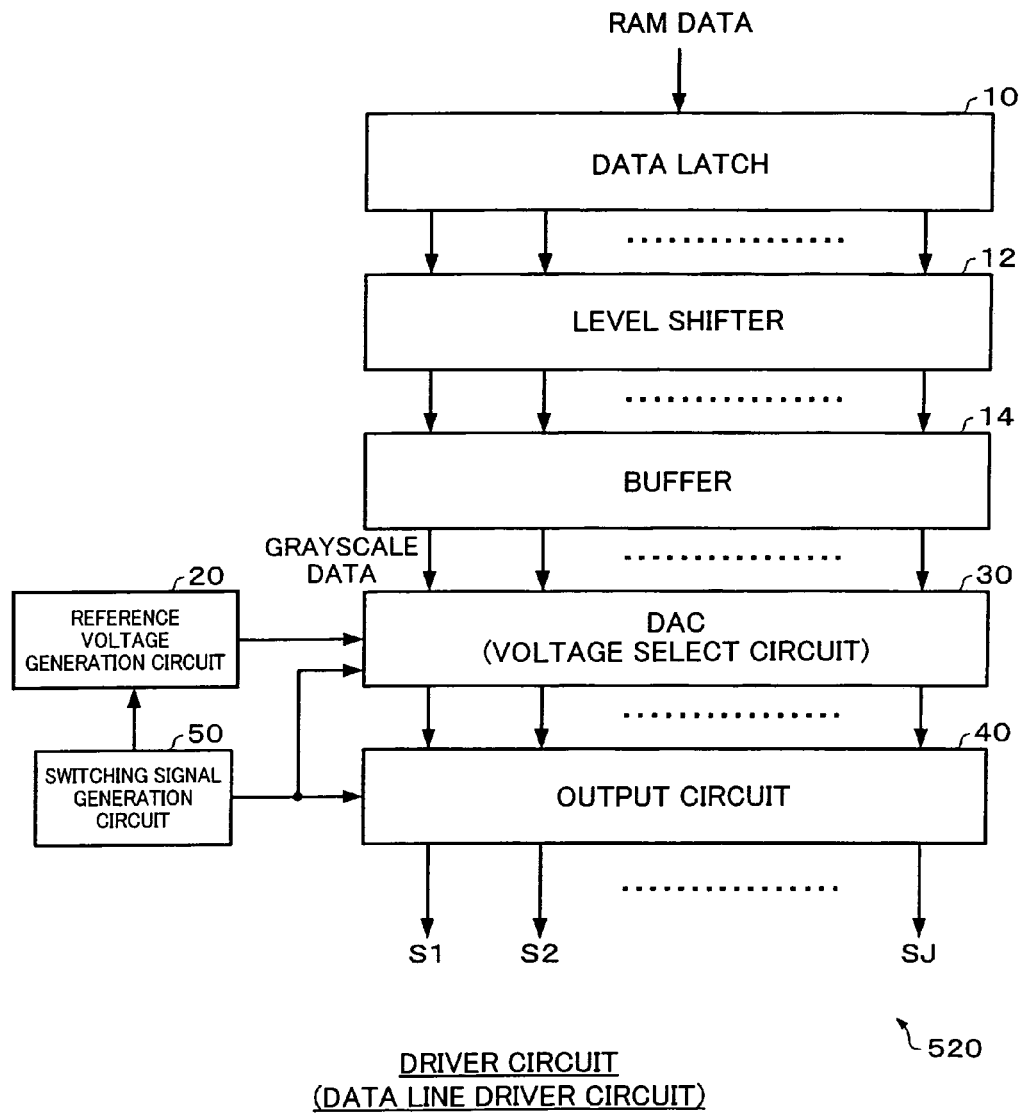
FIG. 2 is a diagram showing a configuration example of a driver circuit.

FIG. 2 is a block diagram showing a configuration example of the data line driver circuit 520. The data line driver circuit 520 includes a data latch 10, a level shifter 12, a buffer 14, a reference voltage generation circuit (voltage generation circuit in a broad sense) 20, a digital/analog conversion circuit (DAC; voltage select circuit) 30, an output circuit 40, and a switching signal generation circuit 50. Note that the configuration of the data line driver circuit 520 is not limited thereto. The data line driver circuit 520 need not necessarily include all of these circuit blocks. The data line driver circuit 520 may have a configuration in which some of these circuit blocks are omitted.

The data line driver circuit 520 may have a configuration in which the reference voltage generation circuit 20, the switching signal generation circuit 50, and the like are omitted, for example.

The data latch 10 latches data from a RAM which is a display memory. The level shifter 12 shifts the voltage level of the output from the data latch 10. The buffer 14 buffers data from the level shifter 12 and outputs the data to the DAC 30 as digital grayscale data.

The reference voltage generation circuit 20 may include a gamma correction resistor ladder, and generates a plurality of reference voltages for generating a grayscale voltage.

The DAC 30 converts digital grayscale data (R, G, and B data) from the buffer 14 into an analog grayscale voltage using the reference voltages from the reference voltage generation circuit 20. In more detail, the DAC 30 decodes the digital grayscale data, selects one of the reference voltages based on the decode result, and outputs the selected reference voltage to the output circuit 40 as an analog grayscale voltage. A decoder included in the DAC 30 may be realized by a ROM or the like.

The output circuit 40 does not include an operational amplifier, but includes a switching device which switches (ON/OFF) the connection between an output terminal of the DAC 30 and the data line. The reference voltage generation circuit 20 includes a voltage-follower-connected operational amplifier (impedance conversion circuit in a broad sense) instead of providing an operational amplifier in the output circuit 40.

The output circuit 40 is a circuit which transmits the analog grayscale voltage from the DAC 30 to the data line. The output circuit 40 may include a switching device which ON/OFF controls the connection between the output terminal of the DAC 30 and the data line (switching device for setting the data line in a high impedance state during polarity reversal of the common voltage).

The switching signal generation circuit 50 generates switching signals for ON/OFF controlling the switching devices included in the reference voltage generation circuit 20, the DAC 30, and the output circuit 40.

3. Reference Voltage Generating Circuit 3.1. Configuration

Figure 3:
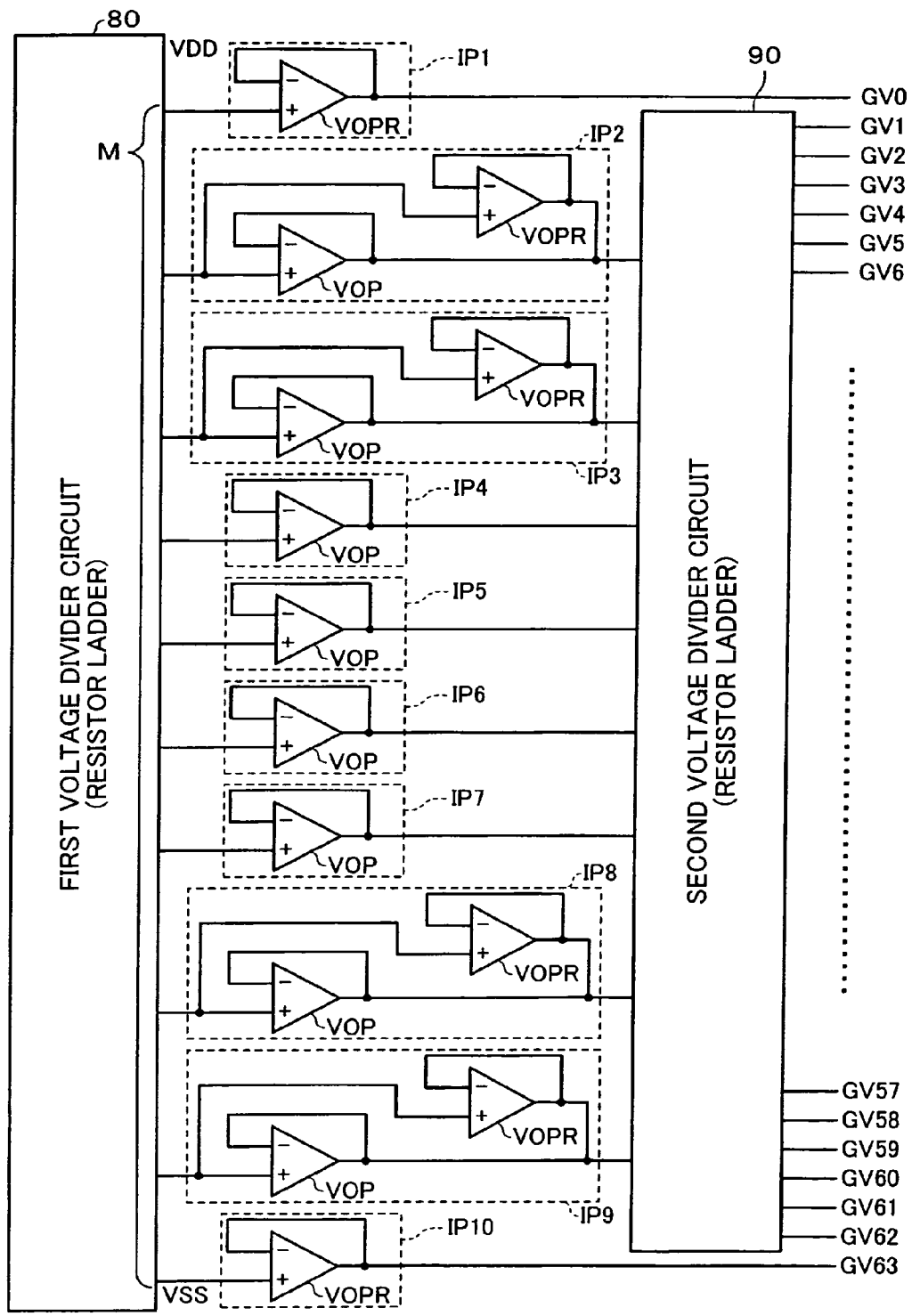
FIG. 3 is a configuration example of a reference voltage generation circuit.

FIG. 3 is a diagram showing a configuration example of the reference voltage generation circuit 20. The reference voltage generation circuit 20 includes a first voltage divider circuit (voltage divider circuit in a broad sense) 80, a plurality of impedance conversion circuits IP1 to IP10 (first to Mth impedance conversion circuits in a broad sense; M is an integer of two or more) performing impedance conversion of the voltage supplied from the first voltage divider circuit 80, and a second voltage divider circuit 90.

The impedance conversion circuits IP1 to IP3 (first to Pth (P<M) impedance conversion circuits in a broad sense) and the impedance conversion circuits IP8 to IP10 (Qth (P<Q<M) to Mth impedance conversion circuits in a broad sense) respectively include a rail-to-rail type operational amplifier VOPR (operational amplifier of a first type in a broad sense) of which the operational range is set between a voltage VDD (first power supply voltage in a broad sense) and a voltage VSS (second power supply voltage in a broad sense), for example.

Figure 4:
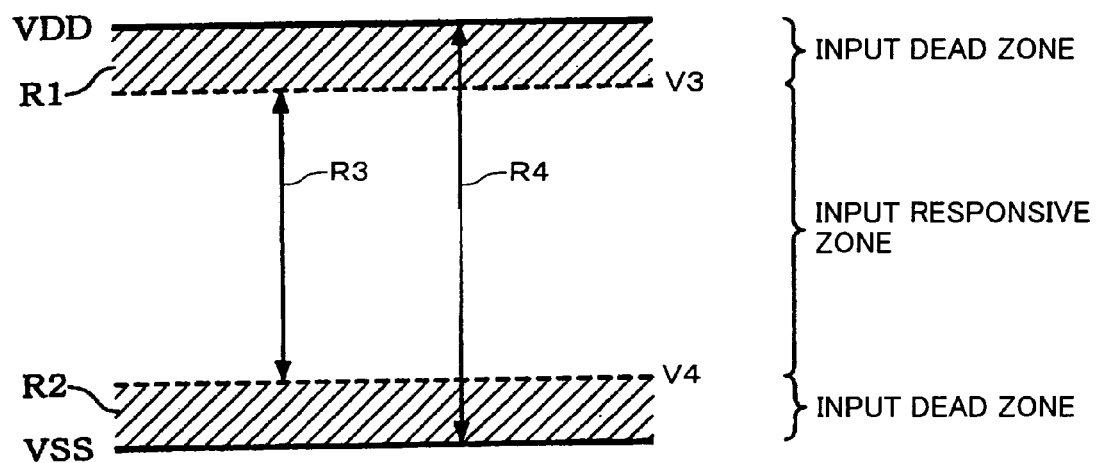
FIG. 4 is diagram illustrative of the operational range of an operational amplifier.

The impedance conversion circuits IP4 to IP7 ((P+1)th to (Q−1)th impedance conversion circuits in a broad sense) respectively include a normal type operational amplifier VOP (operational amplifier of a second type in a broad sense) of which the operational range is set between a voltage V3 (third voltage in a broad sense) lower than the voltage VDD and a voltage V4 (fourth voltage in a broad sense) which is lower than the voltage V3 and higher than the voltage VSS. FIG. 4 shows the operational range of the normal type operational amplifier VOP. The normal type operational amplifier VOP has an input dead zone in which the input voltage and the output voltage cannot be made equal, as indicated by R1 and R2 in FIG. 4. This originates in the threshold value of the transistor to which the input voltage is supplied. Specifically, the operational range of the normal type operational amplifier VOP is between the voltage V3 and the voltage V4, as indicated by R3. On the other hand, the rail-to-rail type operational amplifier VOPR is an operational amplifier operable between the voltage VDD and the voltage VSS, as indicated by R4, for example. Specifically, the operational range differs between the normal type operational amplifier VOP and the rail-to-rail type operational amplifier VOPR. The configurations of the operational amplifiers VOP and VOPR are described later.

The first and second voltage divider circuits 80 and 90 respectively include a resistor ladder in which a plurality of resistor elements are connected in series, and generate the reference voltage at each voltage division terminal of the resistor ladder. The first voltage divider circuit 80 outputs M (e.g. ten in FIG. 3) voltages, for example.

The reference voltage generation circuit 20 generates a plurality of voltages, such as 64 grayscale voltages GV0 to GV63. Note that the configuration of the reference voltage generation circuit 20 is not limited thereto. For example, the number of voltages generated by the reference voltage generation circuit 20 may be increased or decreased by changing the number of operational amplifiers VOP1 to VOP8 or changing the number of resistance divisions of the second voltage divider circuit 90.

The second voltage divider circuit 90 generates a plurality of voltages by dividing the voltages supplied from the operational amplifiers VOP1 to VOP8, the operational amplifiers VOPR1 to VOPR4, and the like using the resistor ladder. The voltages output from the second voltage divider circuit 90 are set at the grayscale voltages GV1 to GV62 output from the reference voltage generation circuit 20, for example.

The voltage VDD (e.g. power supply voltage) and the voltage VSS (e.g. ground voltage) are supplied to the operational amplifiers VOPR5 and VOPR6. The output of the operational amplifier VOPR5 is set at the grayscale voltage GV0 output from the reference voltage generation circuit 20, for example. The output of the operational amplifier VOPR6 is set at the grayscale voltage GV63, for example.

The configuration of the reference voltage generation circuit 20 is not limited to the above-described configuration. For example, the second voltage divider circuit 90 may be omitted from the reference voltage generation circuit 20. The number of operational amplifiers VOP and VOPR of the reference voltage generation circuit 20 is only an example. The configuration of the operational amplifiers VOP and VOPR is not limited to the above-described configuration. For example, the number of operational amplifiers VOP may be set at nine, ten, eleven, or the like, or may be set at seven, six, or the like. Or, the operational amplifiers VOPR2 and VOPR3 of the impedance conversion circuits IP3 and IP8 may be omitted, or a rail-to-rail type operational amplifier VOPR may be provided in the subsequent stage of the operational amplifiers VOP of the impedance conversion circuits IP4 to IP7.

For example, the impedance conversion circuits IP2, IP3, IP8, and IP9 respectively include the normal type operational amplifier VOP and the rail-to-rail type operational amplifier VOPR. In the impedance conversion circuits IP2, IP3, IP8, and IP9, the two operational amplifiers VOP and VOPR are exclusively ON/OFF controlled based on information set in a register (initialization register in a broad sense), for example. For example, when the operational amplifier VOP is turned ON in the impedance conversion circuit IP2, the operational amplifier VOPR is turned OFF. Since the unused operational amplifiers VOP and VOPR are turned OFF, unnecessary power consumption can be reduced.

As described above, the operational amplifiers VOP and VOPR of the impedance conversion circuits IP2, IP3, IP8, and IP9 can be flexibly ON/OFF controlled. Therefore, the reference voltage generation circuit 20 can flexibly deal with the display characteristics (e.g. gamma characteristics) of various panels. The user can store an optimum setting for the display characteristics of the application target panel by appropriately setting information in the initialization register. This allows the reference voltage generation circuit 20 to always supply the optimum grayscale voltages GV0 to GV63 to the panel at a low power consumption.

Figure 5:
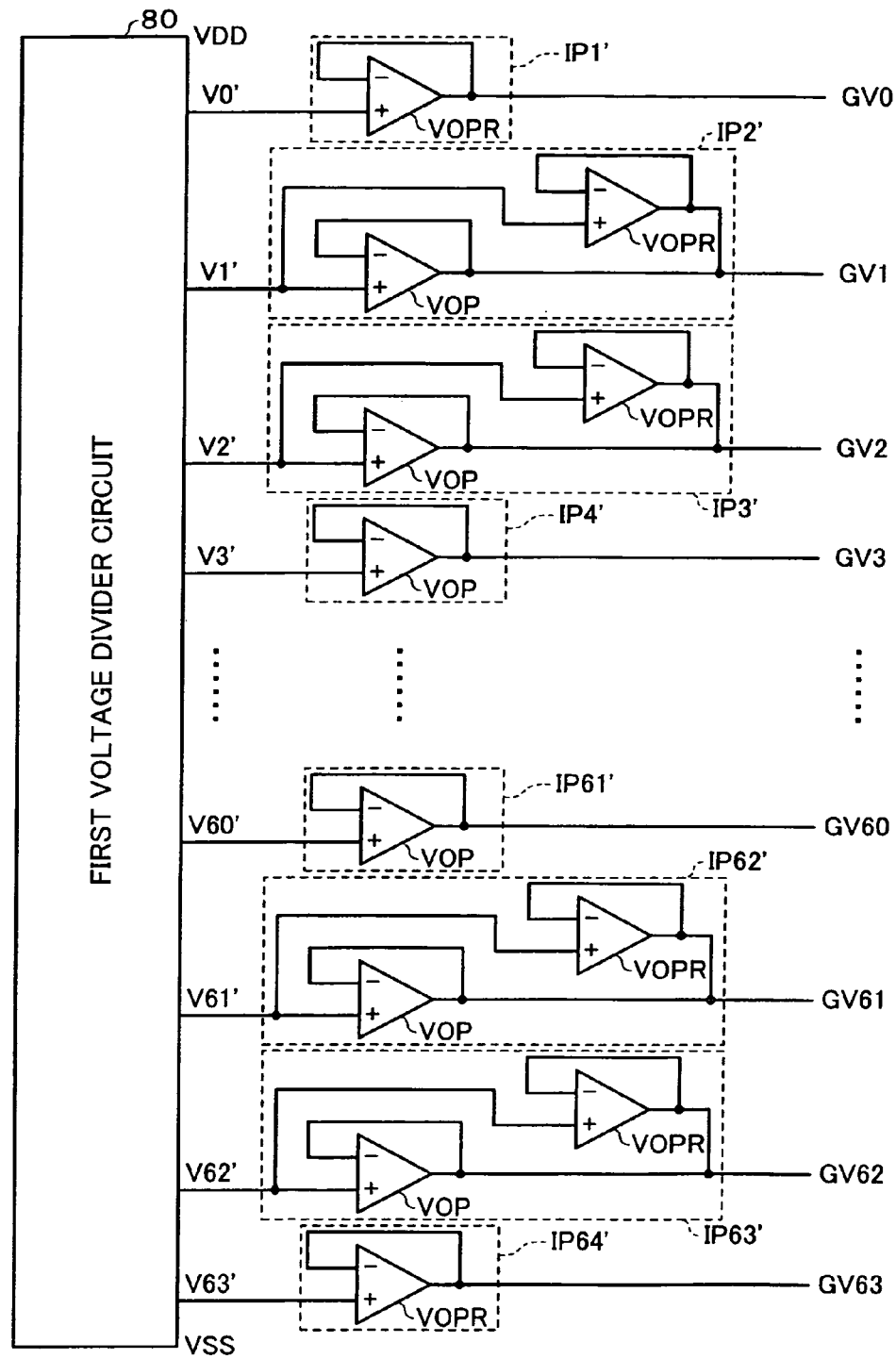
FIG. 5 is another configuration example of a reference voltage generation circuit.

As shown in FIG. 5, the second voltage divider circuit 90 may be omitted, and the operational amplifiers may be used to output the grayscale voltages GV0 to GV63. A reference voltage generation circuit 21 shown in FIG. 5 includes impedance conversion circuits IP1' to IP64' corresponding to 64-grayscale display, for example. The outputs of the impedance conversion circuits IP1' to IP64' are set at the grayscale voltages GV0 to GV63. The first voltage divider circuit 80 outputs 64 voltages V0' to V63'.

The rail-to-rail type operational amplifiers VOPR are provided in the impedance conversion circuits IP1' to IP3' and IP62' to IP64', and the normal type operational amplifiers VOP are provided in the impedance conversion circuits IP2' to IP63'. In the impedance conversion circuits IP2', IP3', IP62', and IP63', the rail-to-rail type operational amplifier VOPR and the normal type operational amplifier VOP are exclusively ON/OFF controlled based on the setting information in the same manner as described above.

Figure 6:
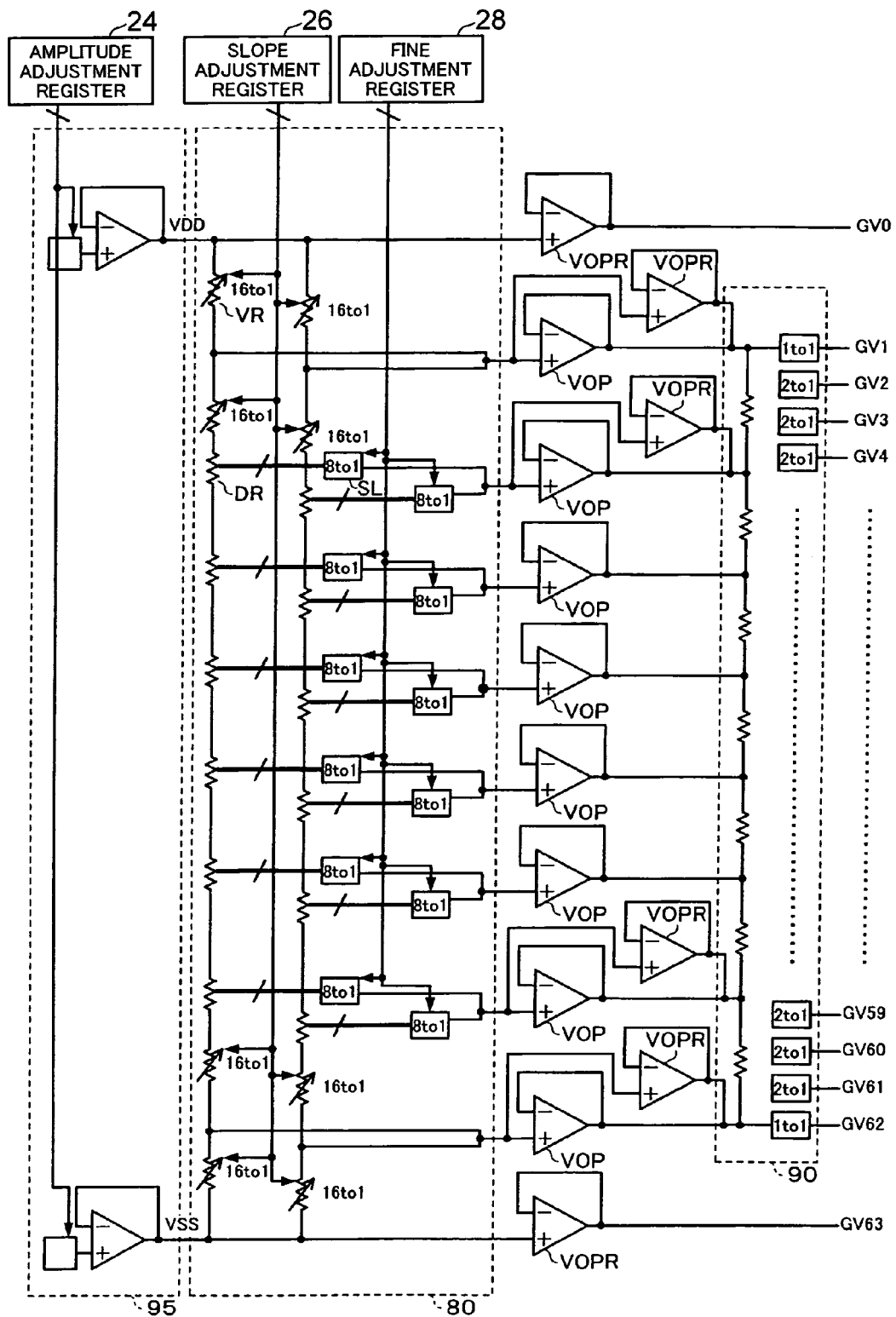
FIG. 6 is a circuit diagram of a configuration example of a voltage divider circuit.

FIG. 6 shows the details of the first and second voltage divider circuits 80 and 90 of the reference voltage generation circuit 20 shown in FIG. 3. A voltage generation circuit 95 generates the voltages supplied to the first voltage divider circuit 80 based on information set in an amplitude adjustment register 24. In FIG. 6, the voltage VDD and the voltage VSS are supplied to the first voltage divider circuit 80, for example.

The first voltage divider circuit 80 includes a plurality of variable resistors VR and a plurality of ladder resistors DR. The slope of a change in the grayscale voltages GV0 to GV63 is adjusted by a slope adjustment register 26. The slope adjustment register 26 stores information which sets the resistance of the variable resistor VR. The resistance of the variable resistor VR is set based on the information set in the slope adjustment register 26. The symbol "16 to 1" in FIG. 6 means that the resistance of the variable resistor VR can be set at sixteen values and the resistance is selected from the sixteen values, for example.

A fine adjustment register 28 stores information for making fine adjustments to the voltage levels of the grayscale voltages GV0 to GV63. A selector SL selects one of a plurality of voltages obtained by voltage division using the ladder resistors DR based on the information set in the fine adjustment register. The symbol "8 to 1" in FIG. 6 means selecting one of eight voltages obtained by voltage division, for example.

The registers 24, 26, and 28 store information which can be arbitrarily set by the user.

The second voltage divider circuit 90 includes a resistor ladder in which a plurality of resistors are connected in series. The grayscale voltages GV1 to GV62 are based on the voltages obtained by voltage division using the second voltage divider circuit 90. The symbols "2 to 1" are provided corresponding to the grayscale voltages GV2 to GV61 because the grayscale voltages GV2 to GV61 are changed depending on whether the reference voltage VCOM is positive or negative. For example, one of two voltages provided as the grayscale voltage GV2 is selected when the reference voltage VCOM is positive, and the other voltage is selected when the reference voltage VCOM is negative. This is because the gamma correction characteristics (grayscale characteristics) are asymmetrical between the positive period and the negative period of the reference voltage VCOM. Specifically, an optimum gamma correction can be performed in each of the positive period and the negative period of the reference voltage VCOM, even when the gamma correction characteristics (grayscale characteristics) are asymmetrical, by changing the resistance division of the resistor ladder for the positive period and the negative period, as shown in FIG. 6. In the first voltage divider circuit 80, the voltages input to the impedance conversion circuits IP3 to IP8 can be changed by setting the information in the fine adjustment register 28 based on whether the reference voltage VCOM is positive or negative.

3.2. Normal Type Operational Amplifier VOP

Figure 7:
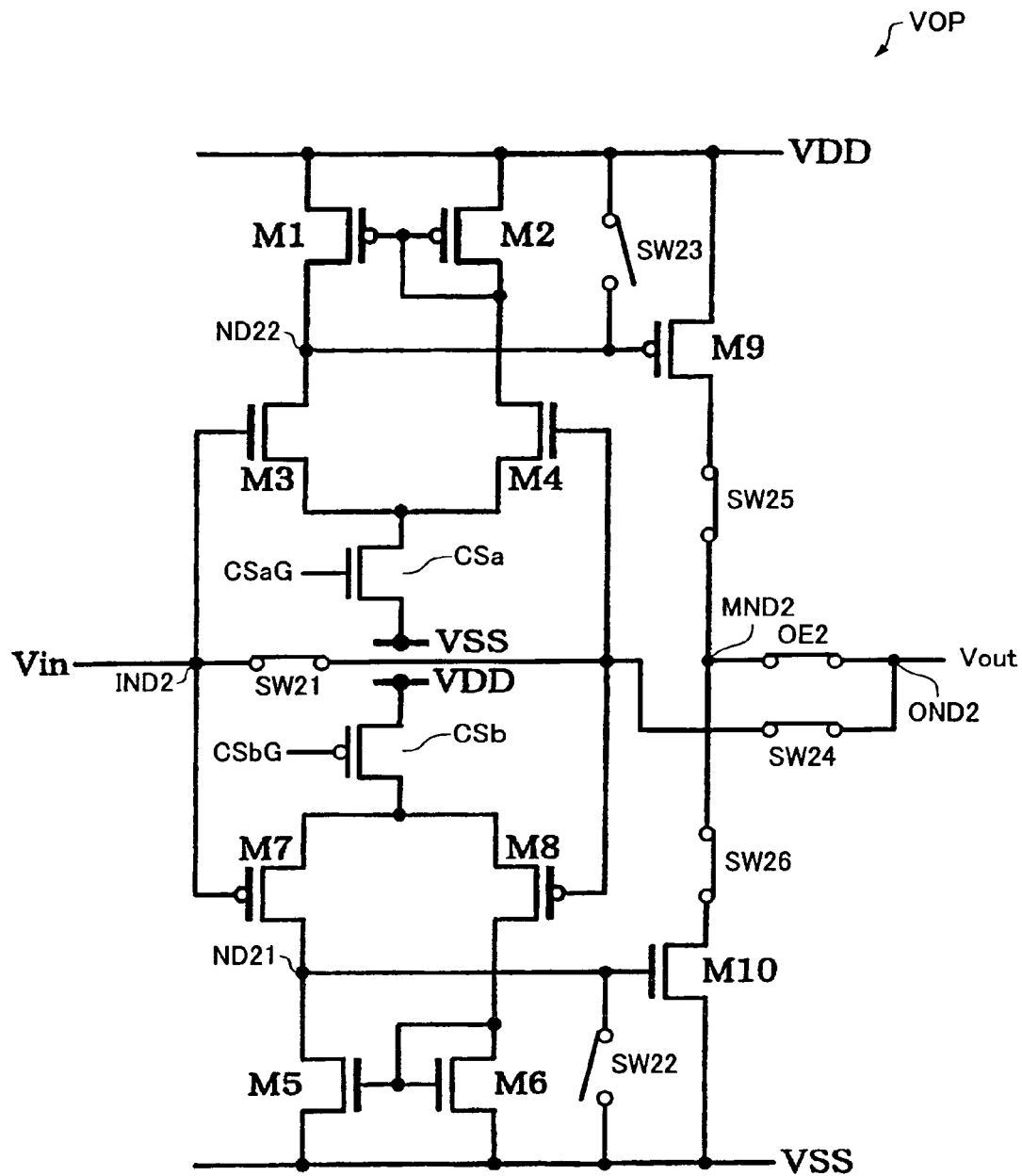
FIG. 7 is a circuit diagram of a configuration example of an operational amplifier of a second type.

FIG. 7 shows a circuit example of the normal type operational amplifier VOP. In the operational amplifier VOP shown in FIG. 7, an n-type driver transistor M10 is controlled by a p-type differential input circuit including p-type transistors M7 and M8, n-type transistors M5 and M6, and a transistor CSb (bias current transistor in a broad sense). A p-type driver transistor M9 is controlled by an n-type differential input circuit including p-type transistors M1 and M2, n-type transistors M3 and M4, and a transistor CSa (bias current transistor in a broad sense).

Consider the case where the voltage of an input signal Vin is higher than the voltage of an output signal Vout using the n-type differential input circuit. In this case, since the impedance of the n-type transistor M4 becomes greater than the impedance of the n-type transistor M3, the gate voltages of the p-type transistors M2 and M1 are increased, whereby the impedance of the p-type transistor M1 is increased. Therefore, the gate voltage of the p-type driver transistor M9 is decreased, whereby the p-type driver transistor M9 approaches the ON state.

In the p-type differential input circuit, when the voltage of the input signal Vin is higher than the voltage of the output signal Vout, since the impedance of the p-type transistor M8 becomes smaller than the impedance of the p-type transistor M7, the gate voltages of the n-type transistors M5 and M6 are increased, whereby the impedance of the n-type transistor M5 is decreased. Therefore, the gate voltage of the n-type driver transistor M10 is decreased, whereby the n-type driver transistor M10 approaches the OFF state.

As described above, when the voltage of the input signal Vin is higher than the voltage of the output signal Vout, the p-type driver transistor M9 and the n-type driver transistor M10 operate in such a manner that the voltage of the output signal Vout is increased. An operation opposite to the above-described operation is performed when the voltage of the input signal Vin is lower than the voltage of the output signal Vout. As a result of the above-described operation, the operational amplifier transitions to an equilibrium in which the voltage of the input signal Vin is approximately equal to the voltage of the output signal Vout.

However, the input signal Vin is supplied to the p-type transistor M7 as the gate voltage in the p-type differential input circuit, and the input signal Vin is supplied to the n-type transistor M3 as the gate voltage in the n-type differential input circuit. Therefore, the input dead zone in which the voltage of the input signal Vin and the voltage of the output signal Vout cannot be made equal occurs in a range R1 in which the input signal Vin is set at the high-potential-side power supply voltage VDD to "VDD−|Vthp|" (Vthp is the threshold voltage of the p-type transistor M7) and a range R2 in which the input signal Vin is set at the low-potential-side power supply voltage VSS to "VSS+Vthn" (Vthn is the threshold voltage of the n-type transistor M3). This is because the n-type differential input circuit does not operate in the range R2 of the low-potential-side power supply voltage VSS to "VSS+Vthn" since the n-type transistor M3 remains in the OFF state, and the p-type differential input circuit does not operate in the range R1 of the high-potential-side power supply voltage VDD to "VDD−|Vthp|" since the p-type transistor M7 remains in the OFF state.

Note that the current sources of the n-type differential input circuit and the p-type differential input circuit may be adjusted by adjusting gate voltages CSaG and CSbG respectively input to the gates of the transistors CSa and CSb.

The normal type operational amplifier VOP includes a switch SW21 (first switch in a broad sense), a switch SW22 (second switch in a broad sense), a switch SW23 (third switch in a broad sense), a switch SW24 (fourth switch in a broad sense), a switch SW25 (fifth switch in a broad sense), a switch SW26 (sixth switch in a broad sense), and an output enable switch OE2 (output enable switch in a broad sense).

The switch SW21 is provided between an input node IND2 to which the input signal Vin is input and an output node OND2 (output section in a broad sense) from which the output signal Vout is output. The switch SW22 is provided between a power supply (second power supply in a broad sense) which generates the voltage VSS and an output node ND21. The switch SW23 is provided between a power supply (first power supply in a broad sense) which generates the voltage VDD and an output node ND22. The switch SW24 is provided between the output node OND2 and the gate of the transistor M4. The switch SW25 is provided between the power supply which generates the voltage VDD and a middle node MND2. The switch SW26 is provided between the power supply which generates the voltage VSS and the middle node MND2. The output enable switch OE2 is provided between the middle node MND2 and the output node OND2.

For example, when the normal type operational amplifier VOP is turned ON in the impedance conversion circuit IP2, IP3, IP8, IP9, or the like shown in FIG. 3, the switch SW21, the switch SW24, the switch SW25, the switch SW26, and the output enable switch OE2 are turned ON. The switches SW22 and SW23 are turned OFF. Specifically, the state as shown in FIG. 7 is created.

Figure 8:
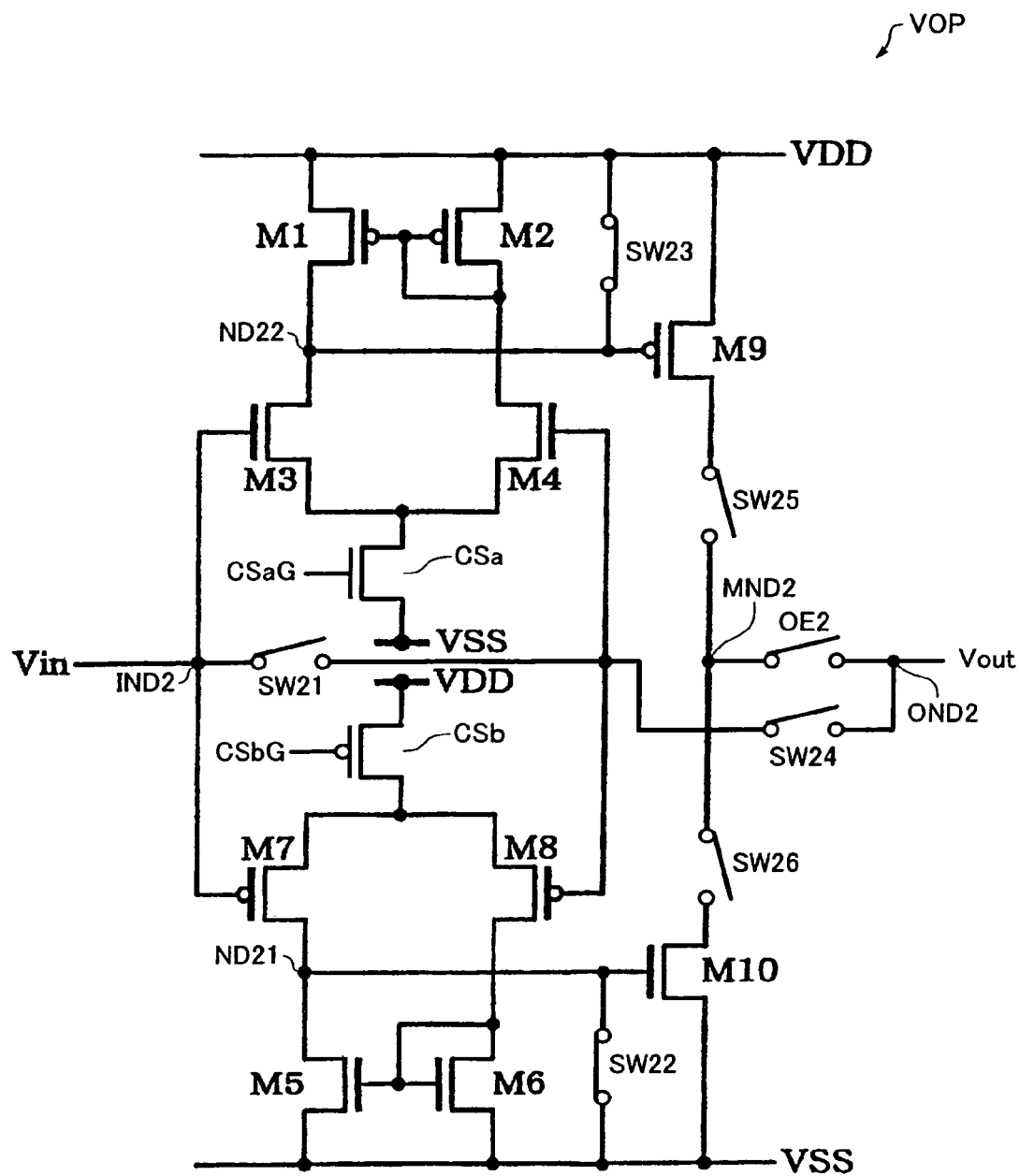
FIG. 8 is another circuit diagram of a configuration example of an operational amplifier of a second type.

On the other hand, when the rail-to-rail type operational amplifier VOPR is turned ON and the normal type operational amplifier VOP is turned OFF in the impedance conversion circuit IP2 or the like, the switch SW21, the switch SW24, the switch SW25, the switch SW26, and the output enable switch OE2 are turned OFF. The switches SW22 and SW23 are turned ON. Specifically, the state as shown in FIG. 8 is created. This causes transistors M9 and M10 to be reliably turned OFF, whereby the output node OND2 is set in a high impedance state. The supply of current from the current sources of the n-type differential input circuit and the p-type differential input circuit can be stopped by controlling the gate voltages CSaG and CSbG respectively input to the gates of the transistors CSa and CSb (e.g. turning OFF the transistors CSa and CSb). This prevents unnecessary power consumption by the normal type operational amplifier VOP when the normal type operational amplifier VOP is turned OFF.

3.3. Rail-to-rail Type Operational Amplifier VOPR

Figure 9:
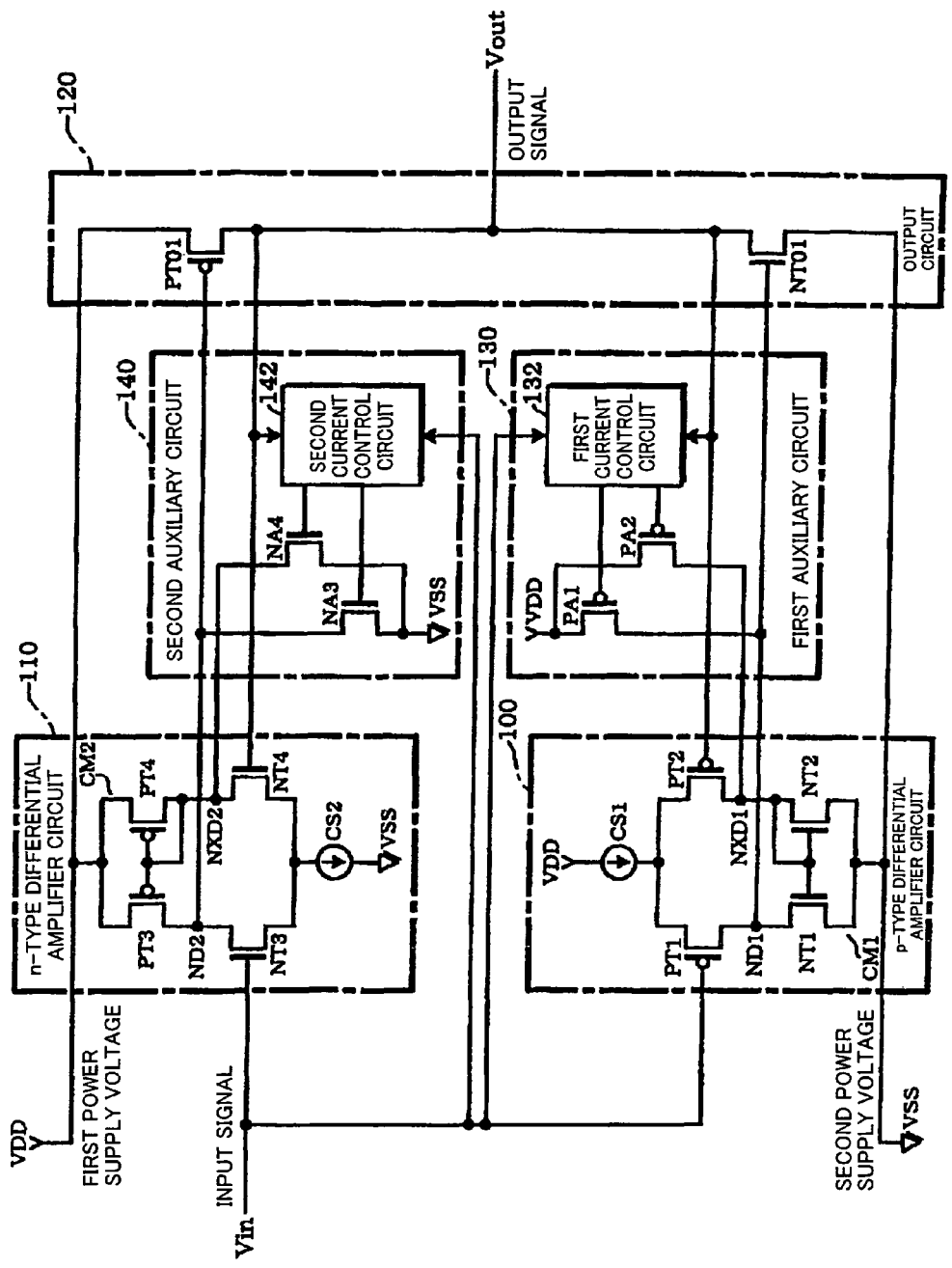
FIG. 9 is a diagram showing a configuration example of an operational amplifier according to one embodiment of the invention.

FIG. 9 shows a configuration example of the rail-to-rail type operational amplifier VOPR according to this embodiment.

The operational amplifier VOPR includes a p-type (e.g. first conductivity type) differential amplifier circuit 100, an n-type (e.g. second conductivity type) differential amplifier circuit 110, and an output circuit 120. The p-type differential amplifier circuit 100, the n-type differential amplifier circuit 110, and the output circuit 120 have an operating voltage between the high-potential-side power supply voltage VDD (first power supply voltage in a broad sense) and the low-potential-side power supply voltage VSS (second power supply voltage in a broad sense).

The p-type differential amplifier circuit 100 amplifies the difference between the input signal Vin and the output signal Vout. The p-type differential amplifier circuit 100 includes an output node ND1 (first output node) and an inversion output node NXD1 (first inversion output node), and outputs the voltage corresponding to the difference between the input signal Vin and the output signal Vout between the output node ND1 and the inversion output node NXD1.

The p-type differential amplifier circuit 100 includes a first current mirror circuit CM1 and a p-type (first conductivity type) first differential transistor pair. The first differential transistor pair includes p-type metal-oxide-semiconductor (MOS) transistors (MOS transistor is hereinafter called "transistor") PT1 and PT2. The sources of the p-type transistors PT1 and PT2 are connected with a first current source CS1, and the input signal Vin and the output signal Vout are respectively input to the gates of the p-type transistors PT1 and PT2. The drain current of the p-type transistors PT1 and PT2 is generated by the first current mirror circuit CM1. The input signal Vin is input to the gate of the p-type transistor PT1. The output signal Vout is input to the gate of the p-type transistor PT2. The drain of the p-type transistor PT1 is the output node ND1 (first output node). The drain of the p-type transistor PT2 is the inversion output node NXD1 (first inversion output node).

The n-type differential amplifier circuit 110 amplifies the difference between the input signal Vin and the output signal Vout. The n-type differential amplifier circuit 110 includes an output node ND2 (second output node) and an inversion output node NXD2 (second inversion output node), and outputs the voltage corresponding to the difference between the input signal Vin and the output signal Vout between the output node ND2 and the inversion output node NXD2.

The n-type differential amplifier circuit 110 includes a second current mirror circuit CM2 and an n-type (second conductivity type) second differential transistor pair. The second differential transistor pair includes n-type transistors NT3 and NT4. The sources of the n-type transistors NT3 and NT4 are connected with a second current source CS2, and the input signal Vin and the output signal Vout are respectively input to the gates of the n-type transistors NT3 and NT4. The drain current of the n-type transistors NT3 and NT4 is generated by the second current mirror circuit CM2. The input signal Vin is input to the gate of the n-type transistor NT3. The output signal Vout is input to the gate of the n-type transistor NT4. The drain of the n-type transistor NT3 is the output node ND2 (second output node). The drain of the n-type transistor NT4 is the inversion output node NXD2 (second inversion output node).

The output circuit 120 generates the output signal Vout based on the voltage of the output node ND1 (first output node) of the p-type differential amplifier circuit 100 and the voltage of the output node ND2 (second output node) of the n-type differential amplifier circuit 110.

The output circuit 120 includes an n-type (second conductivity type) first driver transistor NTO1 and a p-type (first conductivity type) second driver transistor PTO1. The gate (voltage) of the first driver transistor NTO1 is controlled based on the voltage of the output node ND1 (first output node) of the p-type differential amplifier circuit 100. The gate (voltage) of the second driver transistor PTO1 is controlled based on the voltage of the output node ND2 (second output node) of the n-type differential amplifier circuit 110. The drain of the second driver transistor PTO1 is connected with the drain of the first driver transistor NTO1. The output circuit 120 outputs the voltage of the drain of the first driver transistor NTO1 (voltage of the drain of the second driver transistor PTO1) as the output signal Vout.

In the operational amplifier according to this embodiment, the input dead zone is eliminated and a shoot-through current is reduced by providing first and second auxiliary circuits 130 and 140. As a result, power consumption is reduced by reducing the shoot-through current without unnecessarily increasing the range of the operating voltage.

The first auxiliary circuit 130 drives at least one of the output node ND1 (first output node) and the inversion output node NXD1 (first inversion output node) of the p-type differential amplifier circuit 100 based on the input signal Vin and the output signal Vout. The second auxiliary circuit 140 drives at least one of the output node ND2 (second output node) and the second inversion output node NXD2 of the n-type differential amplifier circuit 110 based on the input signal Vin and the output signal Vout.

When the absolute value of the gate-source voltage (voltage between gate and source) of the p-type transistor PT1 (transistor of the first differential transistor pair to which the input signal Vin is input at the gate) is smaller than the absolute value of the threshold voltage of the p-type transistor PT1, the first auxiliary circuit 130 controls the gate voltage of the first driver transistor NTO1 by driving at least one of the output node ND1 (first output node) and the inversion output node NXD1 (first inversion output node).

When the absolute value of the gate-source voltage of the n-type transistor NT3 (transistor of the second differential transistor pair to which the input signal Vin is input at the gate) is smaller than the absolute value of the threshold voltage of the n-type transistor NT3, the second auxiliary circuit 140 controls the gate voltage of the second driver transistor NTO2 by driving at least one of the output node ND2 (second output node) and the inversion output node NXD2 (second inversion output node).

Figure 10:
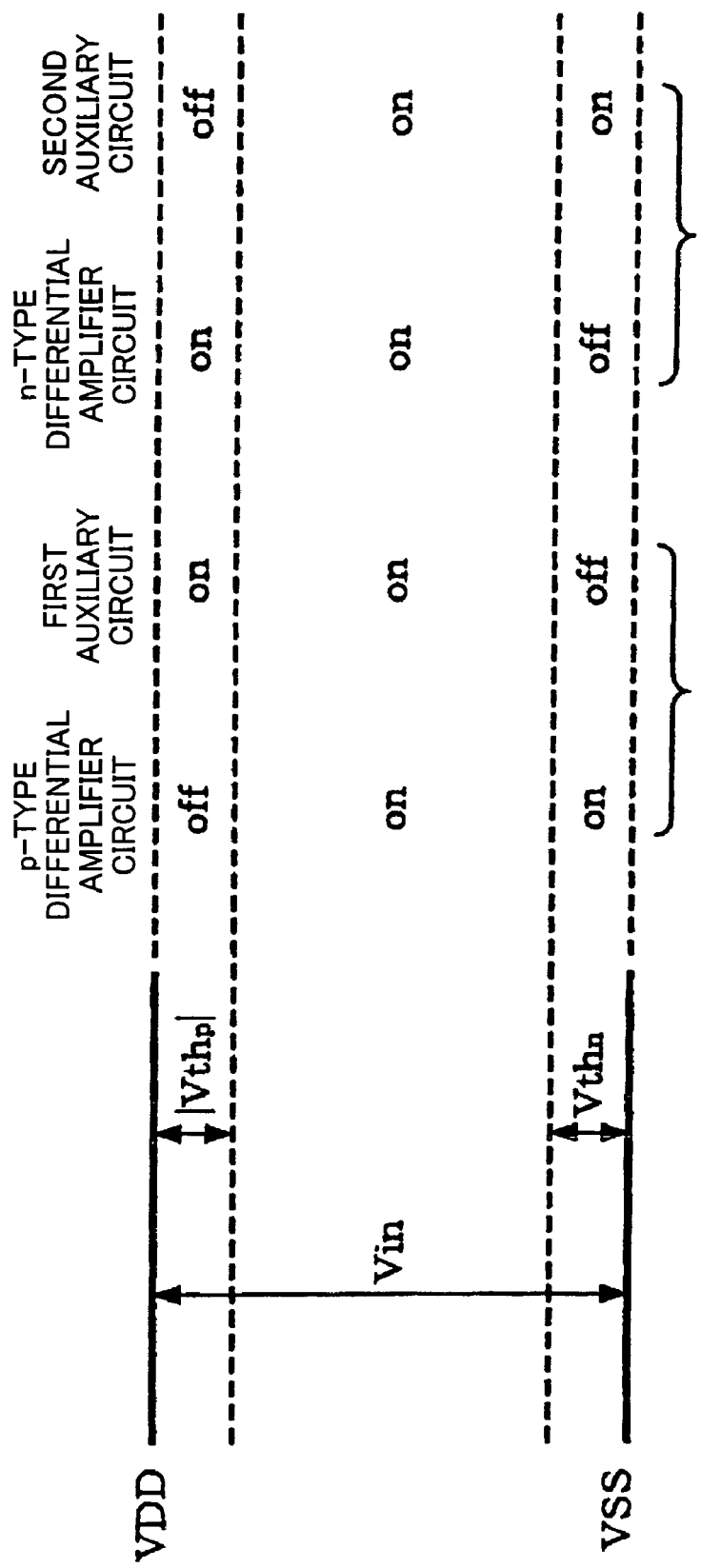
FIG. 10 is a diagram illustrative of the operation of the operational amplifier shown in FIG. 9.

FIG. 10 is a diagram illustrative of the operation of the operational amplifier VOPR shown in FIG. 5.

The high-potential-side power supply voltage is indicated by VDD, the low-potential-side power supply voltage is indicated by VSS, the voltage of the input signal is indicated by Vin, the threshold voltage of the p-type transistor PT1 is indicated by Vthp, and the threshold voltage of the n-type transistor NT3 is indicated by Vthn.

When "VDD≧Vin>VDD−|Vthp|", the p-type transistor is turned OFF, and the n-type transistor is turned ON. When the p-type transistor operates in the cutoff region, the linear region, or the saturation region corresponding to the gate voltage, the statement "the p-type transistor is turned OFF" means that the p-type transistor is in the cutoff region. Likewise, when the n-type transistor operates in the cutoff region, the linear region, or the saturation region corresponding to the gate voltage, the statement "the n-type transistor is turned ON" means that the n-type transistor is in the linear region or the saturation region. Therefore, when "VDD≧Vin>VDD−|Vthp|", the p-type differential amplifier circuit 100 does not operate (OFF), and the n-type differential amplifier circuit 110 operates (ON). Therefore, the first auxiliary circuit 130 is operated (ON) (caused to drive at least one of the output node ND1 (first output node) and the inversion output node NXD1 (first inversion output node)), and the second auxiliary circuit 140 is not operated (OFF) (is not caused to drive the output node ND2 (second output node) and the inversion output node NXD1 (second inversion output node)). The voltage of the output node ND1 does not become variable, even if the input signal Vin is in the range of the input dead zone of the first differential transistor pair of the p-type differential amplifier circuit 100, by causing the first auxiliary circuit 130 to drive the output node ND1 (inversion output node NXD1) of the p-type differential amplifier circuit 100 in the range in which the p-type differential amplifier circuit 100 does not operate.

When "VDD−|Vthp|≧Vin≧Vthn+VSS", the p-type transistor is turned ON, and the n-type transistor is turned ON. When the p-type transistor operates in the cutoff region, the linear region, or the saturation region corresponding to the gate voltage, the statement "the p-type transistor is turned ON" means that the p-type transistor is in the linear region or the saturation region. Therefore, the p-type differential amplifier circuit 100 operates (ON), and the n-type differential amplifier circuit 110 also operates (ON). In this case, the operation of the first auxiliary circuit 130 is turned ON or OFF, and the operation of the second auxiliary circuit 140 is turned ON or OFF. Specifically, the output nodes ND1 and ND2 do not become variable since the p-type differential amplifier circuit 100 and the n-type differential amplifier circuit 110 operate, and the output circuit 120 outputs the output signal Vout in the same manner as in the differential amplifier having the configuration shown in FIG. 13. Therefore, the first and second auxiliary circuits 130 and 140 may be or may not be operated. In FIG. 5, the first and second auxiliary circuits 130 and 140 are operated (ON).

When "Vthn+VSS>Vin≧VSS", the p-type transistor is turned ON, and the n-type transistor is turned OFF. When the n-type transistor operates in the cutoff region, the linear region, or the saturation region corresponding to the gate voltage, the statement "the n-type transistor is turned OFF" means that the n-type transistor is in the cutoff region. Therefore, the n-type differential amplifier circuit 110 does not operate (OFF), and the p-type differential amplifier circuit 100 operates (ON). Therefore, the second auxiliary circuit 140 is operated (ON) (caused to drive at least one of the output node ND2 (second output node) and the inversion output node NXD2 (second inversion output node)), and the first auxiliary circuit 130 is not operated (OFF). The voltage of the output node ND2 does not become variable, even if the input signal Vin is in the range of the input dead zone of the second differential transistor pair of the n-type differential amplifier circuit 110, by causing the second auxiliary circuit 140 to drive the output node ND2 (inversion output node NXD2) of the n-type differential amplifier circuit 110 in the range in which the n-type differential amplifier circuit 110 does not operate.

As described above, the gate voltages of the first and second driver transistors NTO1 and PTO1 of the output circuit 120 can be controlled by the first and second auxiliary circuits 130 and 140, whereby occurrence of unnecessary shoot-through current caused when the input signal Vin is in the range of the input dead zone can be prevented. Moreover, it becomes unnecessary to provide an offset of about 1.9 V taking into consideration the variations of the threshold voltage Vthp of the p-type transistor and the threshold voltage Vthn of the n-type transistor by eliminating the input dead zone of the input signal Vin. Therefore, since the operational amplifier can be formed using the voltage between the high-potential-side power supply voltage VDD and the low-potential-side power supply voltage VSS as the amplitude, the operating voltage can be reduced without decreasing the drive capability, whereby power consumption can be further reduced. This means mounting of a voltage booster circuit and a reduction in voltage of the manufacturing process, whereby cost is reduced.

A detailed configuration example of the operational amplifier VOPR according to this embodiment is described below.

In FIG. 9, the p-type differential amplifier circuit 100 includes the first current source CS1, the first differential transistor pair, and the first current mirror circuit CM1. The high-potential-side power supply voltage VDD (first power supply voltage) is supplied to one end of the first current source CS1. The other end of the first current source CS1 is connected with the sources of the p-type transistors PT1 and PT2 of the first differential transistor pair.

The first current mirror circuit CM1 includes an n-type (second conductivity type) first transistor pair of which the gates are connected. The first transistor pair includes n-type transistors NT1 and NT2. The low-potential-side power supply voltage VSS (second power supply voltage) is supplied to the sources of the n-type transistors NT1 and NT2. The drain of the n-type transistor NT1 is connected with the output node ND1 (first output node). The drain of the n-type transistor NT2 is connected with the inversion output node NXD1 (first inversion output node). The drain and the gate of the n-type transistor NT2 (transistor of the first differential transistor pair connected with the inversion output node NXD1) are connected.

The n-type differential amplifier circuit 110 includes the second current source CS2, the second differential transistor pair, and the second current mirror circuit CM2. The low-potential-side power supply voltage VSS (second power supply voltage) is supplied to one end of the second current source CS2. The other end of the second current source CS2 is connected with the sources of the n-type transistors NT3 and NT4 of the second differential transistor pair.

The second current mirror circuit CM2 includes a p-type (first conductivity type) second transistor pair of which the gates are connected. The second transistor pair includes p-type transistors PT3 and PT4. The high-potential-side power supply voltage VDD (first power supply voltage) is supplied to the sources of the p-type transistors PT3 and PT4. The drain of the p-type transistor PT3 is connected with the output node ND2 (second output node). The drain of the p-type transistor PT4 is connected with the inversion output node NXD2 (second inversion output node). The drain and the gate of the p-type transistor PT4 (transistor of the second differential transistor pair connected with the inversion output node NXD2) are connected.

The first auxiliary circuit 130 may include p-type (first conductivity type) first and second current driver transistors PA1 and PA2 and a first current control circuit 132. The high-potential-side power supply voltage VDD (first power supply voltage) is supplied to the sources of the first and second current driver transistors PA1 and PA2. The drain of the first current driver transistor PA1 is connected with the output node ND1 (first output node). The drain of the second current driver transistor PA2 is connected with the inversion output node NXD1 (first inversion output node).

The first current control circuit 132 controls the gate voltages of the first and second current driver transistors PA1 and PA2 based on the input signal Vin and the output signal Vout. In more detail, when the gate-source voltage (absolute value) of the p-type transistor PT1 of the first differential transistor pair to which the input signal Vin is input at the gate is smaller than the threshold voltage (absolute value) of the p-type transistor PT1, the first current control circuit 132 controls the gate voltages of the first and second current driver transistors PA1 and PA2 so that at least one of the output node ND1 (first output node) and the inversion output node NXD1 (first inversion output node) is driven.

The second auxiliary circuit 140 may include n-type (second conductivity type) third and fourth current driver transistors NA3, and NA4 and a second current control circuit 142. The low-potential-side power supply voltage VSS (second power supply voltage) is supplied to the sources of the third and fourth current driver transistors NA3 and NA4. The drain of the third current driver transistor NA3 is connected with the output node ND2 (second output node). The drain of the fourth current driver transistor NA4 is connected with the inversion output node NXD2 (second inversion output node).

The second current control circuit 142 controls the gate voltages of the third and fourth current driver transistors NA3 and NA4 based on the input signal Vin and the output signal Vout. In more detail, when the gate-source voltage (absolute value) of the n-type transistor NT3 of the second differential transistor pair to which the input signal Vin is input at the gate is smaller than the threshold voltage (absolute value) of the n-type transistor NT3, the second current control circuit 142 controls the gate voltages of the third and fourth current driver transistors NA3 and NA4 so that at least one of the output node ND2 (second output node) and the inversion output node NXD2 (second inversion output node) is driven.

Figure 11:
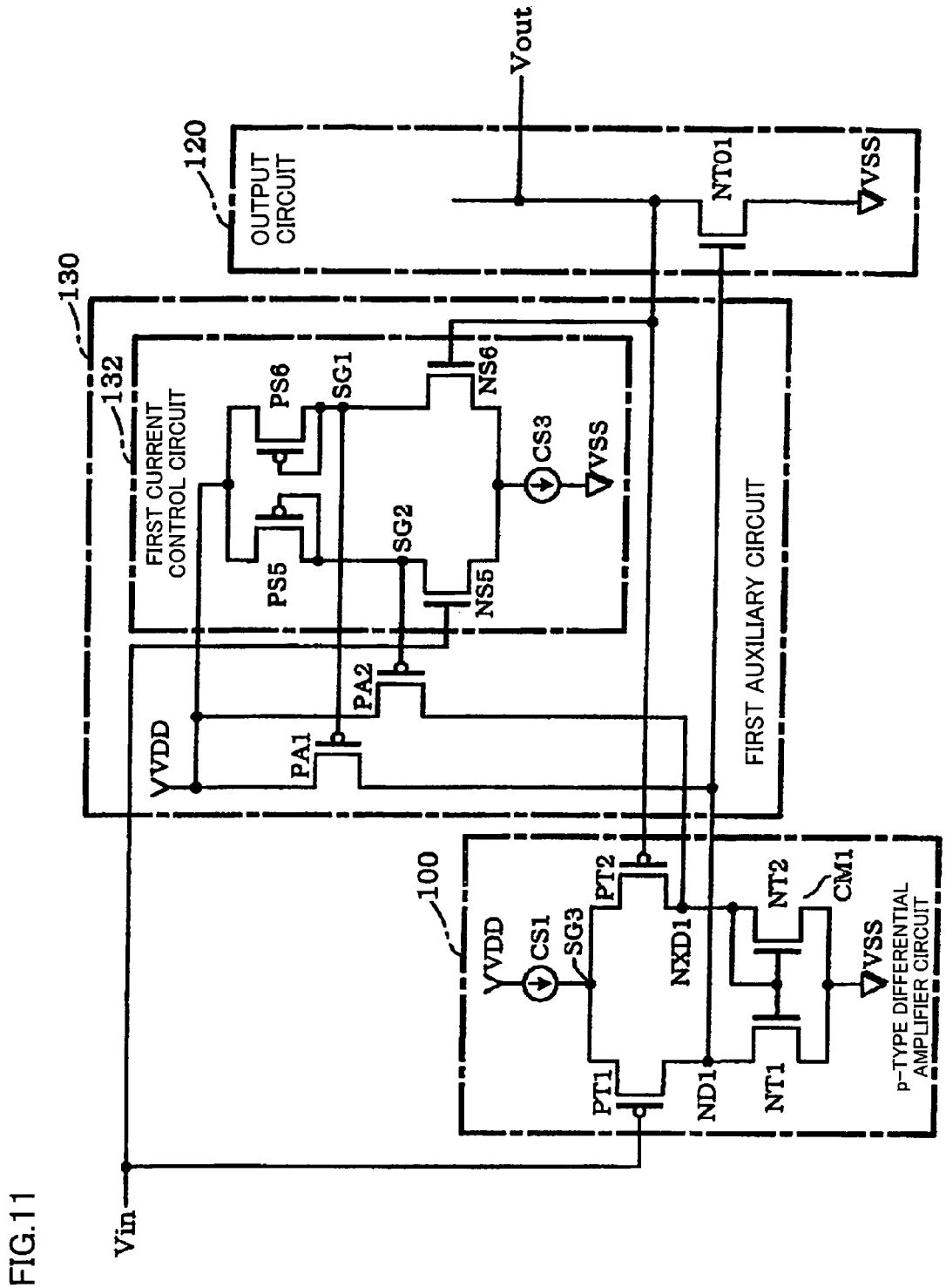
FIG. 11 is a circuit diagram of a configuration example of a first current control circuit.

FIG. 11 shows a configuration example in the first current control circuit 132.

The first current control circuit 132 includes a third current source CS3, an n-type (second conductivity type) third differential transistor pair, and p-type (first conductivity type) fifth and sixth current driver transistors PS5 and PS6.

The low-potential-side power supply voltage VSS (second power supply voltage) is supplied to one end of the third current source CS3.

The third differential transistor pair includes n-type transistor NS5 and NS6. The sources of the n-type transistors NS5 and NS6 are connected with the other end of the third current source CS3. The input signal Vin is input to the gate of the n-type transistor NS5. The output signal Vout is input to the gate of the n-type transistor NS6.

The high-potential-side power supply voltage VDD (first power supply voltage) is supplied to the sources of the fifth and sixth current driver transistors PS5 and PS6. The drain of the fifth current driver transistor PS5 is connected with the drain of the n-type transistor NS5 of the third differential transistor pair. The drain of the sixth current driver transistor PS6 is connected with the drain of the n-type transistor NS6 of the third differential transistor pair. The gate and the drain of the fifth current driver transistor PS5 are connected. The gate and the drain of the sixth current driver transistor PS6 are connected.

The drain of the n-type transistor NS5 of the third differential transistor pair (transistor of the third differential transistor pair to which the input signal Vin is input at the gate) (or, the drain of the fifth current driver transistor PS5) is connected with the gate of the second current driver transistor PA2. The drain of the n-type transistor NS6 of the third differential transistor pair (transistor of the third differential transistor pair to which the output signal Vout is input at the gate) (or, the drain of the sixth current driver transistor PS6) is connected with the gate of the first current driver transistor PA1.

Specifically, the first and sixth current driver transistors PA1 and PS6 form a current mirror circuit. Likewise, the second and fifth current driver transistors PA2 and PS5 form a current mirror circuit.

Figure 12:
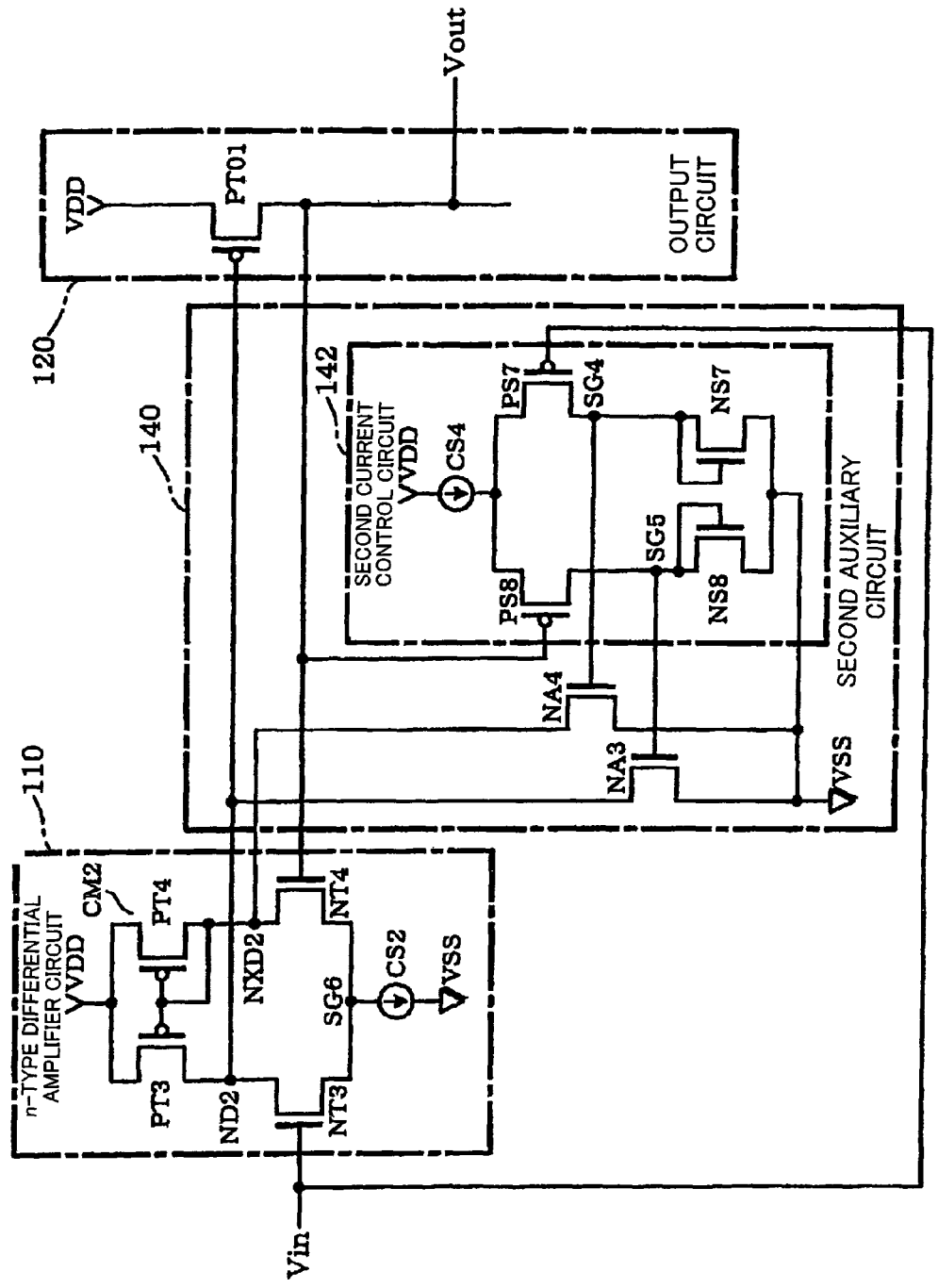
FIG. 12 is a circuit diagram of a configuration example of a second current control circuit.

FIG. 12 shows a configuration example of the second current control circuit 142.

The second current control circuit 142 includes a fourth current source CS4, a p-type (first conductivity type) fourth differential transistor pair, and n-type (second conductivity type) seventh and eighth current driver transistors NS5 and NS8.

The high-potential-side power supply voltage VDD (first power supply voltage) is supplied to one end of the fourth current source CS4.

The fourth differential transistor pair includes p-type transistors PS7 and PS8. The sources of the p-type transistors PS7 and PS8 are connected with the other end of the fourth current source CS4. The input signal Vin is input to the gate of the p-type transistor PS7. The output signal Vout is input to the gate of the p-type transistor PS8.

The low-potential-side power supply voltage VSS (second power supply voltage) is supplied to the sources of the seventh and eighth current driver transistor NS7 and NS8. The drain of the seventh current driver transistor NS7 is connected with the drain of the p-type transistor PS7 of the fourth differential transistor pair. The drain of the eighth current driver transistor NS8 is connected with the drain of the p-type transistor PS8 of the fourth differential transistor pair. The gate and the drain of the seventh current driver transistor NS7 are connected. The gate and the drain of the eighth current driver transistor NS8 are connected.

The drain of the p-type transistor PS7 of the fourth differential transistor pair (transistor of the fourth differential transistor pair to which the input signal Vin is input at the gate) (or, the drain of the seventh current driver transistor NS7) is connected with the gate of the fourth current driver transistor NA4. The drain of the p-type transistor PS8 of the fourth differential transistor pair (transistor of the fourth differential transistor pair to which the output signal Vout is input at the gate) (or, the drain of the eighth current driver transistor NS8) is connected with the gate of the third current driver transistor NA3.

Specifically, the third and eighth current driver transistors NA3 and NS8 form a current mirror circuit. Likewise, the fourth and seventh current driver transistors NA4 and NS7 form a current mirror circuit.

The operation of the operational amplifier having the configuration shown in FIG. 9 is described below taking the case where the first auxiliary circuit 130 includes the first current control circuit 132 having the configuration shown in FIG. 11 and the second auxiliary circuit 140 includes the second current control circuit 142 having the configuration shown in FIG. 12.

When "Vthn+VSS≧Vin>VSS", the p-type transistor PT1 is turned ON so that the p-type differential amplifier circuit 100 normally operates. On the other hand, since the n-type transistor NT3 is not turned ON, the voltage of each node of the n-type differential amplifier circuit 110 becomes variable.

In the second auxiliary circuit 140, since the p-type transistor PS7 is turned ON to decrease the impedance, the gate voltage of the fourth current driver transistor NA4 increases. As a result, the impedance of the fourth current driver transistor NA4 decreases. Specifically, the fourth current driver transistor NA4 drives the inversion output node NXD2 to remove current, whereby the potential of the inversion output node NXD2 decreases. As a result, the impedance of the p-type transistor PT3 decreases, whereby the potential of the output node ND2 increases. Then, the impedance of the second driver transistor PTO1 of the output circuit 120 increases, whereby the potential of the output signal Vout decreases. This decreases the impedance of the p-type transistor PS8, whereby the gate voltage of the third current driver transistor NA3 increases. Therefore, the impedance of the third current driver transistor NA3 decreases, whereby the potential of the output node ND2 decreases.

The result whereby the potential of the output node ND2 is increased by decreasing the impedance of the p-type transistor PT3 is fed back to decrease the impedance of the third current driver transistor NA3, whereby the potential of the output node ND2 is decreased. As a result, the operational amplifier transitions to an equilibrium in which the voltage of the input signal Vin is approximately equal to the voltage of the output signal Vout, whereby the gate voltage of the second driver transistor PTO1 is set at an optimum value.

When "VDD≧Vin>VDD−|Vthp|", the operation of the operational amplifier is the reverse of the above-described operation. Specifically, the n-type transistor NT3 is turned ON so that the n-type differential amplifier circuit 110 normally operates. On the other hand, since the p-type transistor PT1 is not turned ON, the voltage of each node of the p-type differential amplifier circuit 100 becomes variable.

In the first auxiliary circuit 130, since the n-type transistor NS5 is turned ON to decrease the impedance, the gate voltage of the second current driver transistor PA2 decreases. As a result, the impedance of the second current driver transistor PA2 decreases. Specifically, the second current driver transistor PA2 drives the inversion output node NXD1 to supply current, whereby the potential of the inversion output node NXD1 increases. As a result, the impedance of the n-type transistor NT2 decreases, whereby the potential of the output node ND2 decreases. Then, the impedance of the first driver transistor NTO1 of the output circuit 120 increases, whereby the potential of the output signal Vout increases. This decreases the impedance of the n-type transistor NS6, whereby the gate voltage of the first current driver transistor PA1 decreases. Therefore, the impedance of the first current driver transistor PA1 decreases, whereby the potential of the output node ND1 increases.

The result whereby the potential of the output node ND1 is increased by decreasing the impedance of the n-type transistor NT2 is fed back to decrease the impedance of the first current driver transistor PA1, whereby the potential of the output node ND1 is increased. As a result, the operational amplifier transitions to an equilibrium in which the voltage of the input signal Vin is approximately equal to the voltage of the output signal Vout, whereby the gate voltage of the first driver transistor NTO1 is set at an optimum value.

When "VDD−|Vthp|In≧Vin≧Vthn+VSS", since the p-type differential amplifier circuit 100 and the n-type differential amplifier circuit 110 operate so that the potentials of the output nodes ND1 and ND2 are set, the operational amplifier transitions to an equilibrium in which the voltage of the input signal Vin is approximately equal to the voltage of the output signal Vout even if the first and second auxiliary circuits 130 and 140 are not operated.

Figure 13:
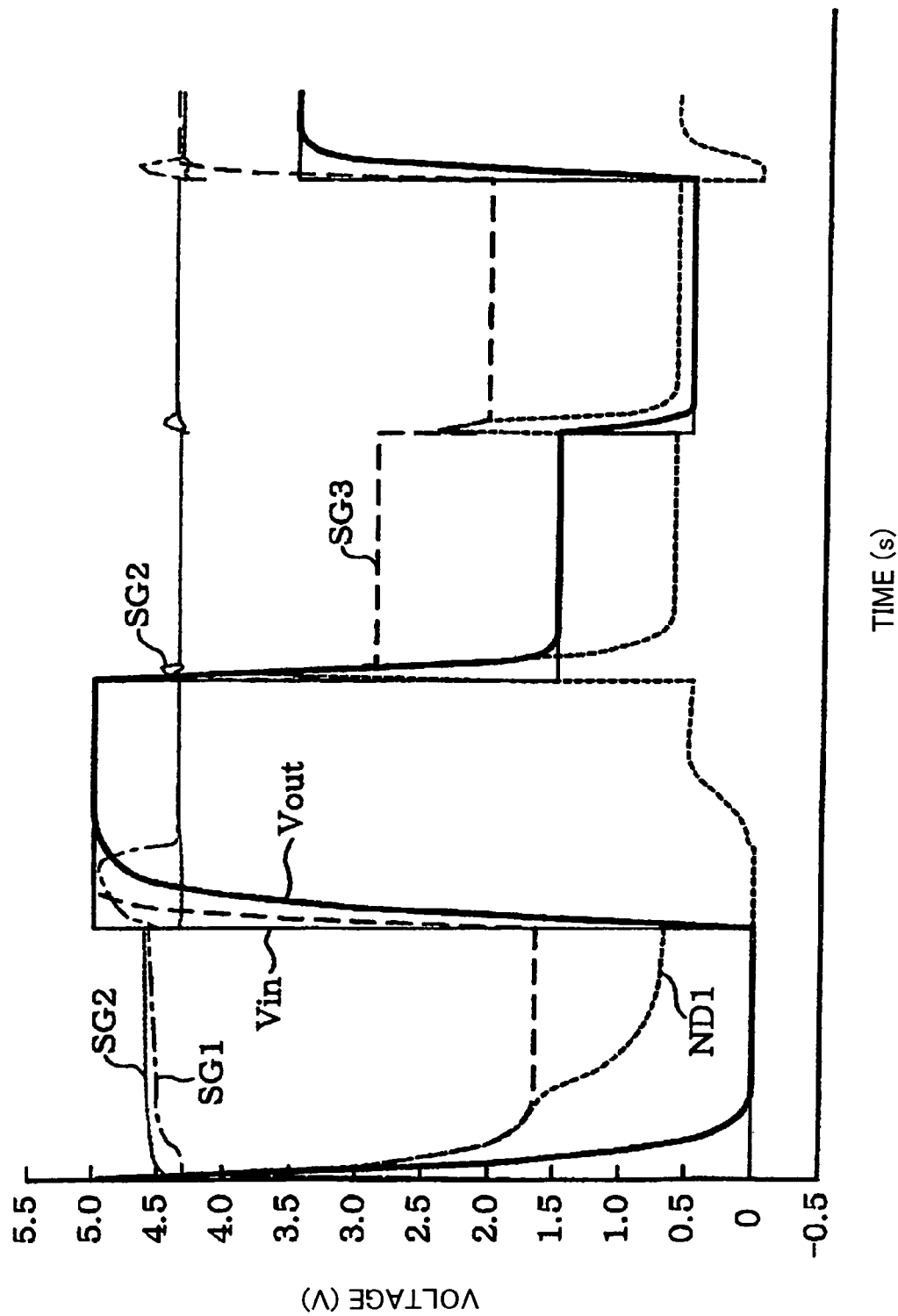
FIG. 13 is a diagram showing simulation results for changes in voltage of nodes of a p-type differential amplifier circuit and a first auxiliary circuit.
Figure 14:
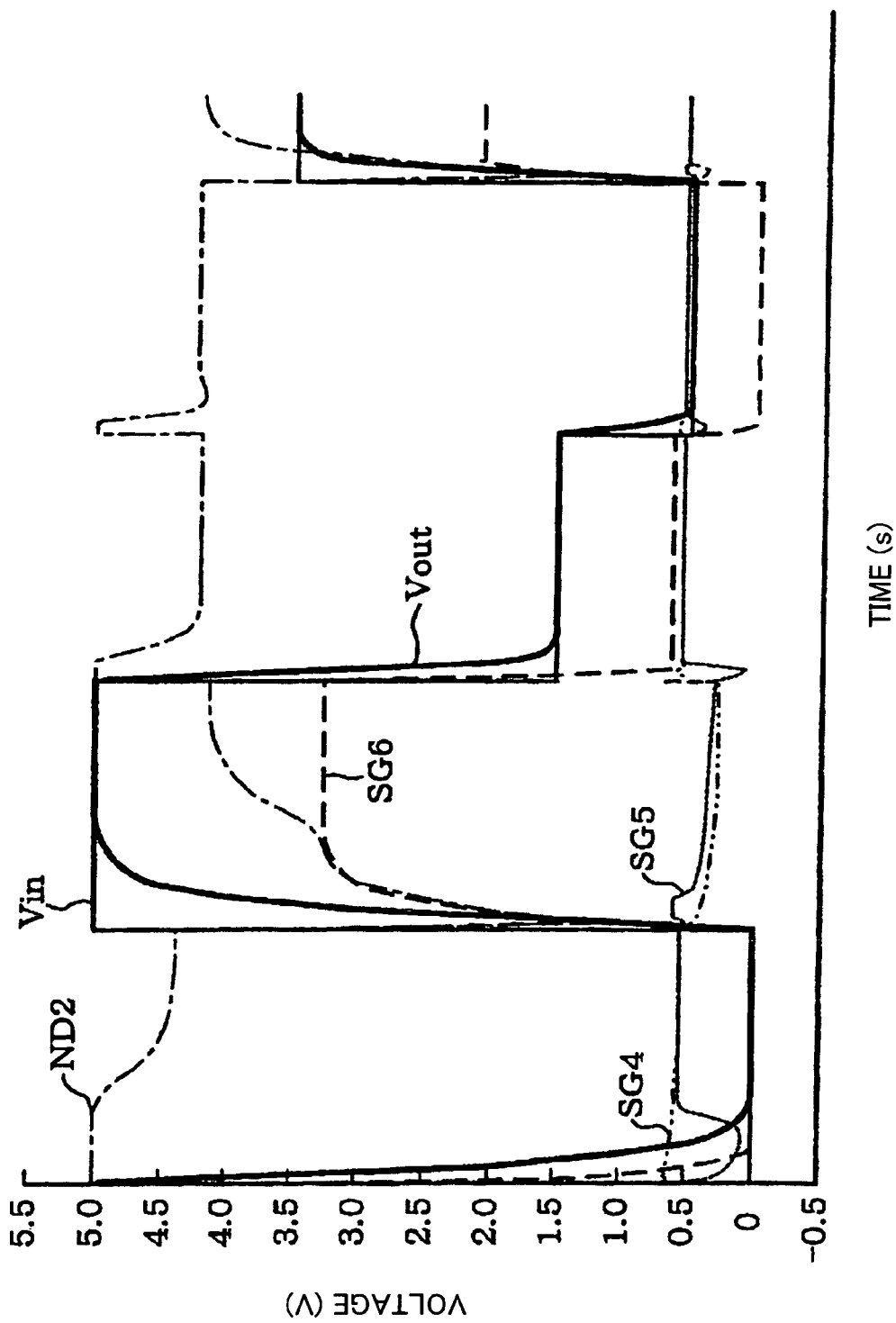
FIG. 14 is a diagram showing simulation results for changes in voltage of nodes of an n-type differential amplifier circuit and a second auxiliary circuit.
Figure 15:
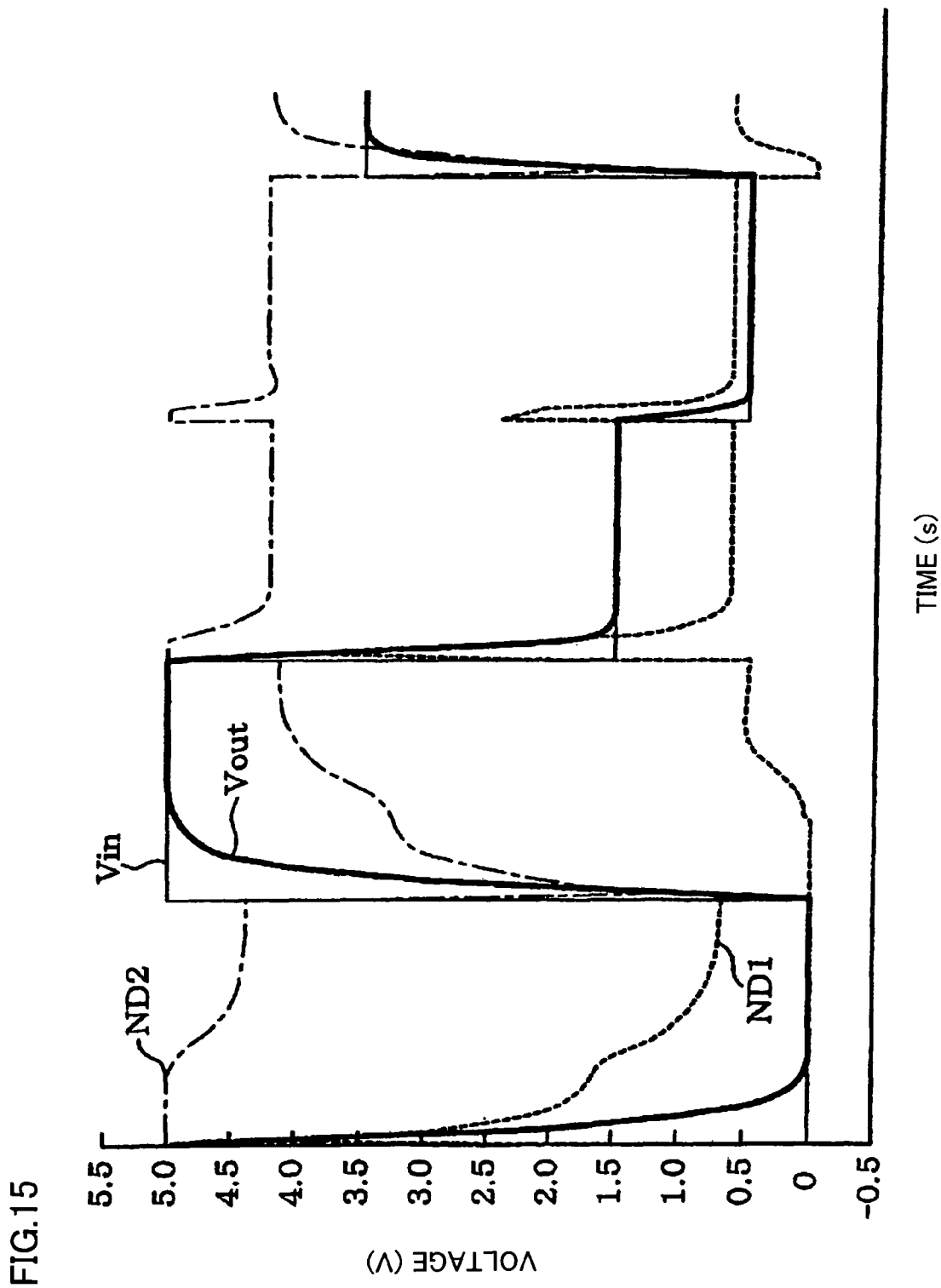
FIG. 15 is a diagram showing simulation results for changes in voltage of output nodes.

FIG. 13 shows simulation results of changes in voltage of the nodes of the p-type differential amplifier circuit 100 and the first auxiliary circuit 130. FIG. 14 shows simulation results of changes in voltage of the nodes of the n-type differential amplifier circuit 110 and the second auxiliary circuit 140. FIG. 15 shows simulation results of changes in voltage of the output nodes ND 1 and ND2.

In FIG. 13, a node SG1 is the gate of the first current driver transistor PA1. A node SG2 is the gate of the second current driver transistor PA2. A node SG3 is the sources of the p-type transistors PT1 and PT2 of the first differential transistor pair. In FIG. 14, a node SG4 is the gate of the fourth current driver transistor NA4. A node SG5 is the gate of the third current driver transistor NA3. A node SG6 provides the source for the n-type transistor NT3 and the n-type transistor NT4 of the second differential transistor pair.

As shown in FIGS. 13 to 15, even if the input signal Vin at about 0.5 V is input, the output node ND1 does not become variable and controls the gate voltage of the first driver transistor NTO1 of the output circuit 120.

As described above, this embodiment enables control which eliminates the input dead zone, allows the rail-to-rail operation, and reliably prevents a shoot-through current of the output circuit 120. Therefore, an operational amplifier which realizes a significant reduction in power consumption can be provided. Moreover, since the class AB operation becomes possible, the data lines can be stably driven regardless of the polarity in the polarity inversion drive which reverses the polarity of the voltage applied to the liquid crystal.

3.3.1 Adjustment of Current Value

In the operational amplifier according to this embodiment, the circuit stability can be improved by further preventing the oscillation of the operational amplifier by optimizing the current values of the current sources of the p-type differential amplifier circuit 100, the n-type differential amplifier circuit 110, the first auxiliary circuit 130, and the second auxiliary circuit 140 during operation.

Figure 16:
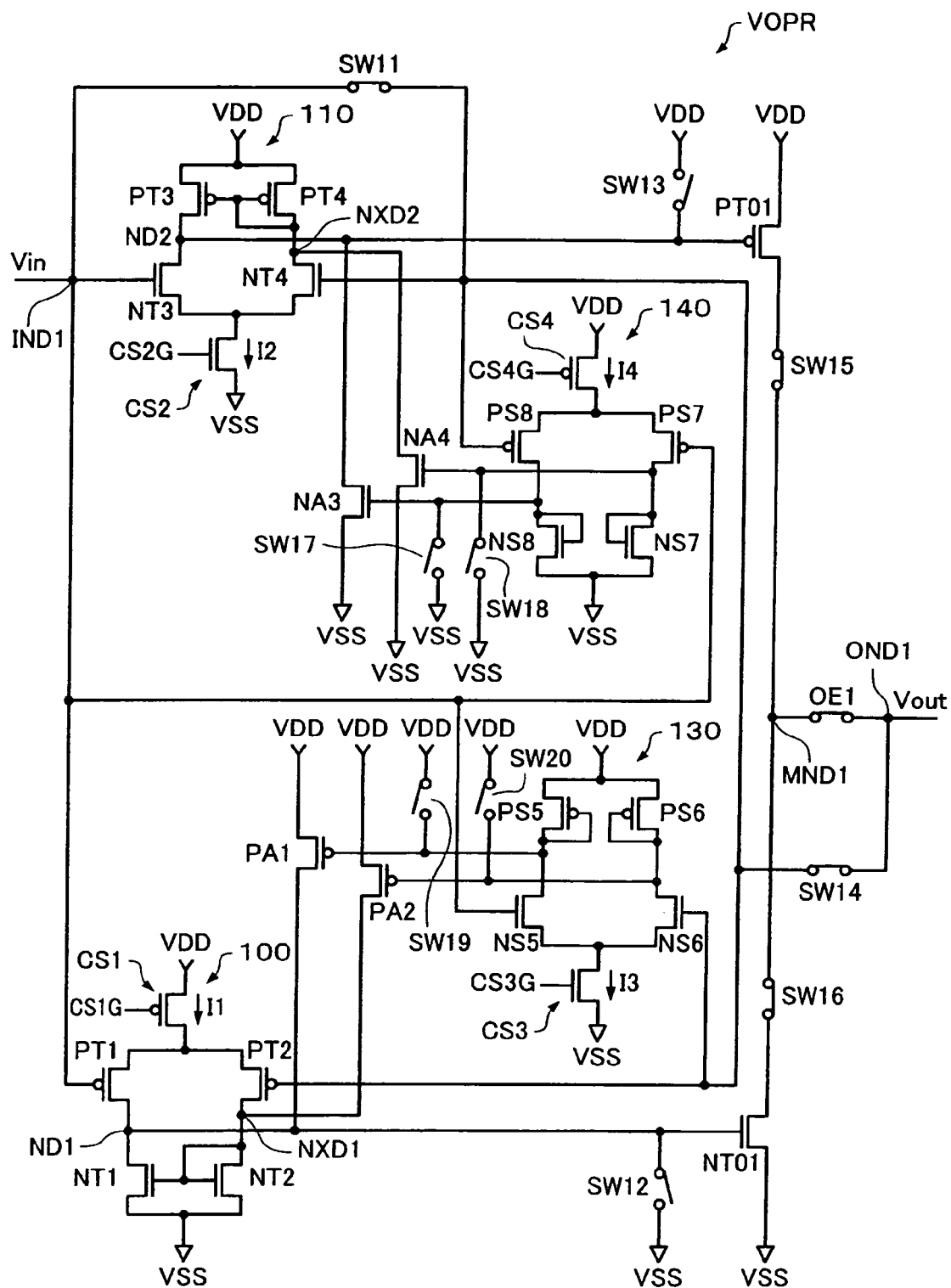
FIG. 16 is another circuit diagram of a configuration example of an operational amplifier according to one embodiment of the invention.

FIG. 16 is a circuit diagram of the operational amplifier VOPR according to this embodiment. In FIG. 16, the current sources CS1 to CS4 are formed by transistors (bias current transistors in a broad sense). In this case, unnecessary current consumption of the current sources can be reduced by controlling gate voltages CS1G, CS2G, CS3G, and CS4G of the transistors.

In order to prevent the oscillation of the operational amplifier according to this embodiment, it is effective to equalize the drain currents of the first and second driver transistors NTO1 and PTO1 of the output circuit 120. The drain current of the first driver transistor NTO1 is determined by a current value I1 of the first current source CS1 of the p-type differential amplifier circuit 100 during operation and a current value I3 of the third current source CS3 of the first auxiliary circuit 130 during operation. The drain current of the second driver transistor PTO1 is determined by a current value I2 of the second current source CS2 of the n-type differential amplifier circuit 110 during operation and a current value I4 of the fourth current source CS4 of the second auxiliary circuit 140 during operation.

Consider the case where the current value I1 is not equal to the current value I3. For example, the current value I1 is "10" and the current value I3 is "5". Likewise, consider the case where the current value I2 is not equal to the current value I4. For example, the current value I2 is "10" and the current value I4 is "5".

When the voltage of the input signal Vin is in such a range that the p-type differential amplifier circuit 100 and the first auxiliary circuit 130 operate, the drain current of the first driver transistor NTO1 flows in an amount corresponding to "15" (=I1+I3=10+5), for example. Likewise, when the voltage of the input signal Vin is in such a range that the n-type differential amplifier circuit 110 and the second auxiliary circuit 140 operate, the drain current of the second driver transistor PTO1 flows in an amount corresponding to "15" (=I2+I4=10+5), for example.

On the other hand, when the voltage of the input signal Vin decreases to such an extent that the n-type transistor does not operate, the n-type differential amplifier circuit 110 and the first auxiliary circuit 130 stop the operation. Therefore, current does not flow through the second and third current sources CS2 and CS3 (I2=0, I3=0). Therefore, the drain current of the first driver transistor NTO1 flows in an amount corresponding to "10" (=I1), and the drain current of the second driver transistor PTO1 flows in an amount corresponding to "5" (=I4), for example. This also applies to the case where the voltage of the input signal Vin increases to such an extent that the p-type transistor does not operate, for example.

As described above, when the rising edge or the falling edge of the output signal Vout varies due to the difference in drain current between the first and second driver transistors NTO1 and PTO1 of the output circuit 120, the time in which the output becomes stable differs, whereby the oscillation of the operational amplifier tends to occur.

Therefore, in the operational amplifier according to this embodiment, it is preferable that the current values of the first and third current sources CS1 and CS3 during operation be equal (I1=I3) and the current values of the second and fourth current sources CS2 and CS4 during operation be equal (I2=I4). This is achieved by equalizing the channel lengths L of the transistors forming the first to fourth current sources CS1 to CS4, equalizing the channel widths of the transistors forming the first and third current sources CS1 and CS3, and equalizing the channel widths of the transistors forming the second and fourth current sources CS2 and CS4.

It is also preferable that the current values of the first to fourth current sources CS1 to CS4 during operation be equal (I1=I2=I3=I4). This facilitates the design.

In addition, power consumption can be further reduced by reducing at least one of the current values of the third and fourth current sources CS3 and CS4 during operation. In this case, it is necessary to reduce at least one of the current values of the third and fourth current sources CS3 and CS4 during operation without decreasing the current drive capability of the first to fourth current driver transistors PA1, PA2, NA3, and NA4.

3.3.2. Reduction in Current Value

Figure 18:
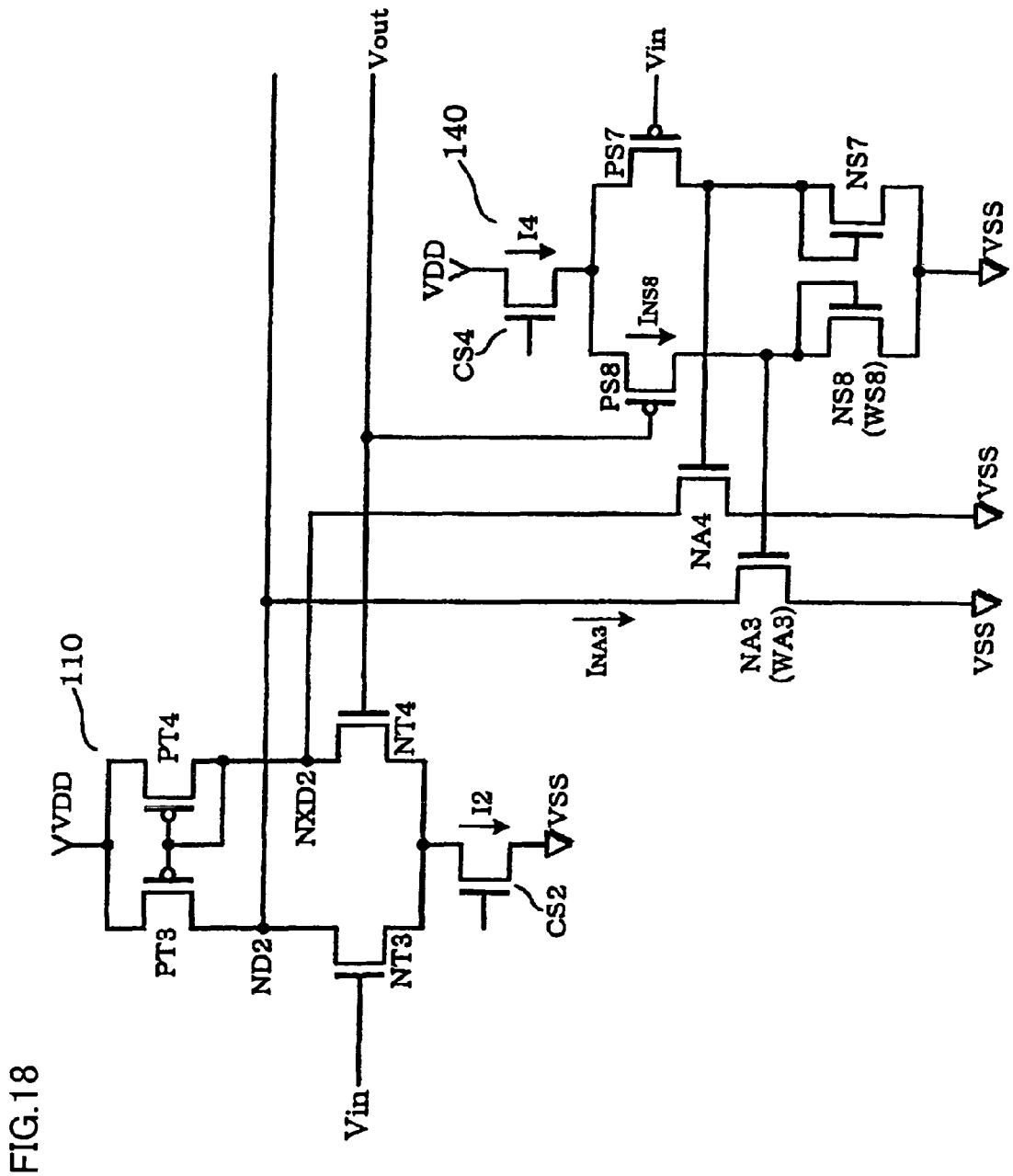
FIG. 18 is a diagram illustrative of a configuration example which reduces the current value of a fourth current source during operation.

FIG. 18 is a diagram illustrative of a configuration example of reducing the current value of the fourth current source CS4 during operation.

In FIG. 18, the current value of the fourth current source CS4 during operation is reduced by utilizing the configuration in which the third and eighth current driver transistors NA3 and NS8 form a current mirror circuit. The channel length and the channel width of the third current driver transistor NA3 are respectively indicated by L and WA3, the drain current of the third current driver transistor NA3 is indicated by INA3, the channel length and the channel width of the eighth current driver transistor NS8 are respectively indicated by L and WS8, and the drain current of the eighth current driver transistor NS8 is indicated by INS8. In this case, INA3 equals "(WA3/WS8)×INS8". The ratio "WA3/WS8" indicates the ratio of the current drive capability of the third current driver transistor NA3 to the current drive capability of the eighth current driver transistor NS8. Therefore, the drain current INS8 can be reduced without decreasing the current drive capability of the third current driver transistor NA3 by making the ratio "WA3/WS8" greater than one, whereby the current value I4 of the fourth current source CS4 during operation can be reduced.

Note that the current value may be reduced by utilizing the configuration shown in FIG. 12 in which the fourth and seventh current driver transistors NA4 and NS7 form a current mirror circuit.

Likewise, it is preferable to reduce the current value of the third current source CS3 during operation. In this case, the current value of the third current source CS3 is reduced by utilizing the configuration in which the first and sixth current driver transistors PA1 and PS6 form a current mirror circuit or the configuration in which the second and fifth current driver transistors PA2 and PS5 form a current mirror circuit.

As described above, at least one of the ratio of the current drive capability of the first current driver transistor PA1 to the current drive capability of the sixth current driver transistor PS6, the ratio of the current drive capability of the second current driver transistor PA2 to the current drive capability of the fifth current driver transistor PS5, the ratio of the current drive capability of the third current driver transistor NA3 to the current drive capability of the eighth current driver transistor NS8, and the ratio of the current drive capability of the fourth current driver transistor NA4 to the current drive capability of the seventh current driver transistor NS7 is set at a value greater than one. This reduces the current value of at least one of the third and fourth current sources CS3 and CS4 during operation.

3.3.3. ON/OFF Control of Operational Amplifier VOPR

As shown in FIG. 16, the rail-to-rail type operational amplifier VOPR includes a switch SW11 (first switch in a broad sense), a switch SW12 (second switch in a broad sense), a switch SW13 (third switch in a broad sense), a switch SW14 (fourth switch in a broad sense), a switch SW15 (fifth switch in a broad sense), a switch SW16 (sixth switch in a broad sense), and an output enable switch OE1 (output enable switch in a broad sense).

The switch SW11 is provided between an input node IND1 to which the input signal Vin is input and an output node OND1 (output section in a broad sense) from which the output signal Vout is output. The switch SW12 is provided between the power supply which generates the voltage VSS and the output node ND1. The switch SW13 is provided between the power supply which generates the voltage VDD and the output node ND2. The switch SW14 is provided between the output node OND1 and the gate of the transistor NT4. The switch SW15 is provided between the power supply which generates the voltage VDD and a middle node MND1. The switch SW16 is provided between the power supply which generates the voltage VSS and the middle node MND. The output enable switch OE1 is provided between the middle node MND1 and the output node OND1.

The rail-to-rail type operational amplifier VOPR further includes switches SW17 to SW20.

The switch SW17 (third auxiliary switch in a broad sense) is provided between the gate of the transistor NA3 of the second auxiliary circuit 140 and the power supply which generates the voltage VSS. The switch SW18 (fourth auxiliary switch in a broad sense) is provided between the gate of the transistor NA4 of the second auxiliary circuit 140 and the power supply which generates the voltage VSS. The switch SW19 (first auxiliary switch in a broad sense) is provided between the gate of the transistor PA1 of the first auxiliary circuit 130 and the power supply which generates the voltage VDD. The switch SW20 (second auxiliary switch in a broad sense) is provided between the gate of the transistor PA2 of the first auxiliary circuit 130 and the power supply which generates the voltage VDD.

For example, when the rail-to-rail type operational amplifier VOPR is turned ON in the impedance conversion circuit IP2, IP3, IP8, IP9, or the like shown in FIG. 3, the switch SW11, the switch SW14, the switch SW15, the switch SW16, and the output enable switch OE1 are turned ON. The switches SW12 and SW13 are turned OFF. Specifically, the state as shown in FIG. 16 is created.

Figure 17:
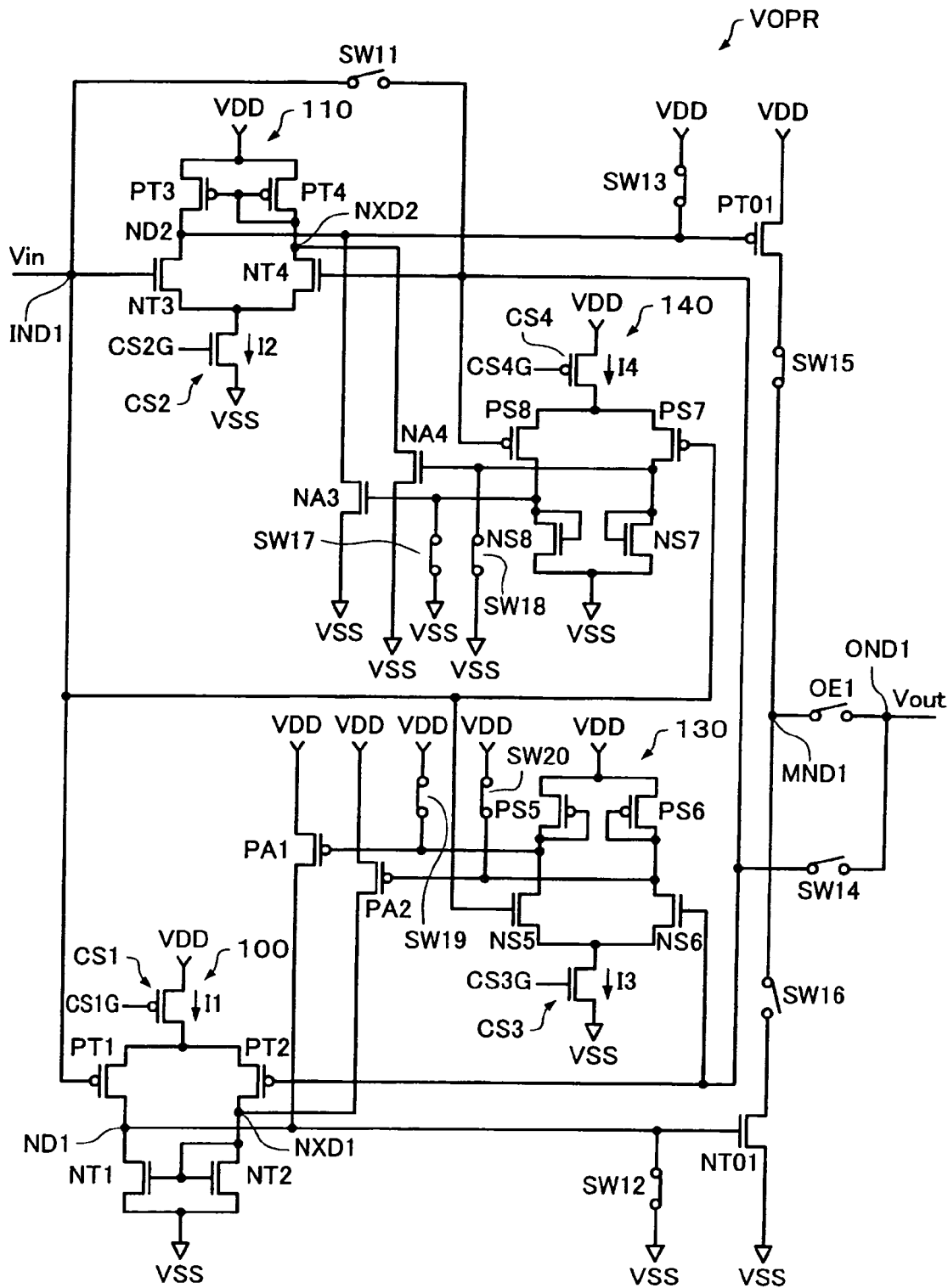
FIG. 17 is yet another circuit diagram of a configuration example of an operational amplifier according to one embodiment of the invention.

On the other hand, when the rail-to-rail type operational amplifier VOPR is turned OFF and the normal type operational amplifier VOP is turned ON in the impedance conversion circuit IP2 or the like, the switch SW11, the switch SW14, the switch SW15, the switch SW16, and the output enable switch OE1 are turned OFF. The switches SW12 and SW13 are turned ON. Specifically, the state as shown in FIG. 17 is created. This causes transistors PT01 and NT01 to be reliably turned OFF, whereby the output node OND1 is set in a high impedance state. The supply of current from each current source can be stopped by controlling the gate voltages CS1G, CS2G, CS3G, and CS4G input to the gates of the transistors of the current sources CS1 to CS4 (e.g. turning OFF the transistors forming the current sources CS1 to CS4). This prevents unnecessary power consumption by the rail-to-rail type operational amplifier VOPR when the rail-to-rail type operational amplifier VOPR is turned OFF.

3.4. Operation of Reference Voltage Generating Circuit

Figure 19:
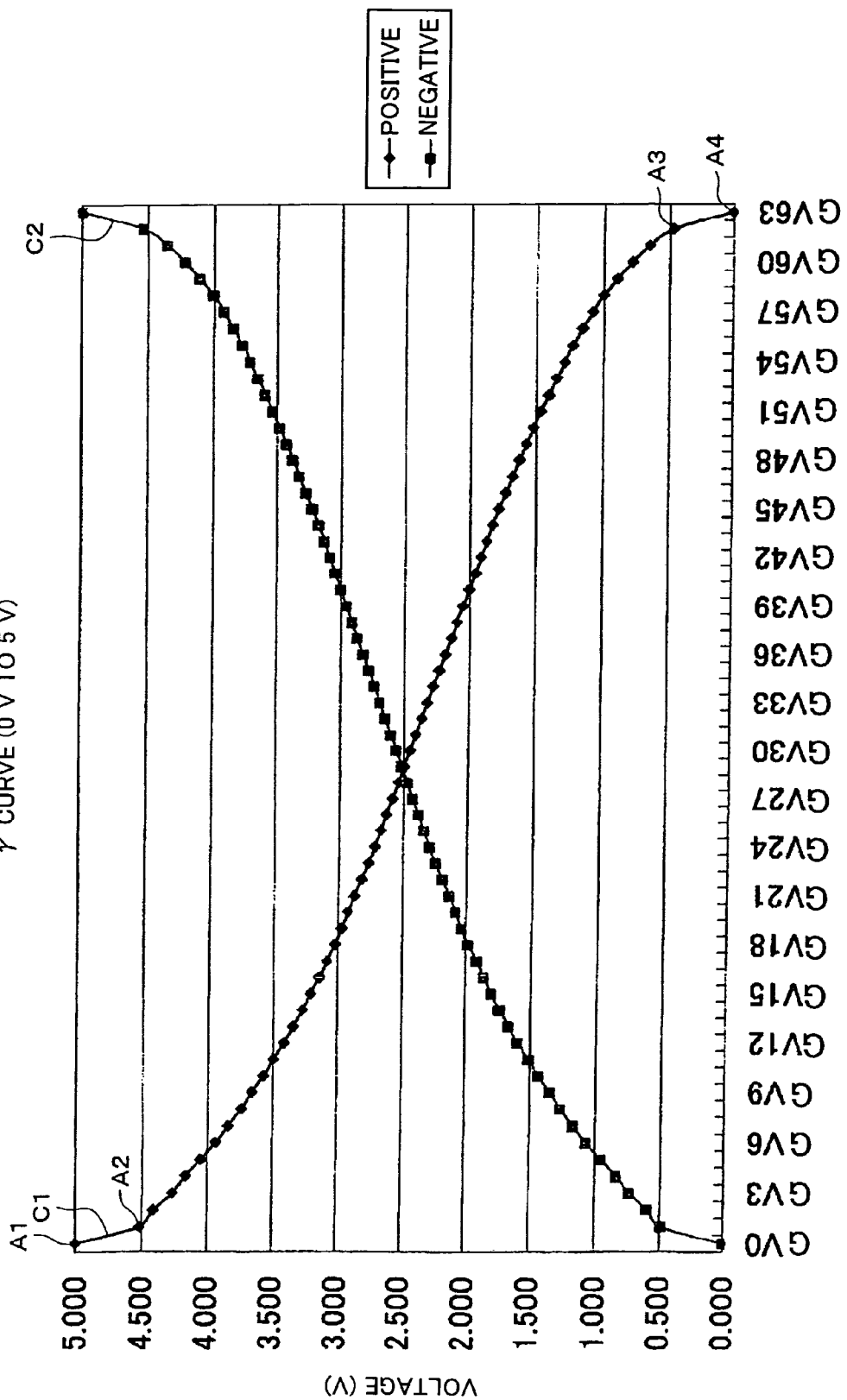
FIG. 19 is a diagram showing an example of a gamma curve.

FIG. 19 shows a gamma curve of a panel driven at a voltage of 0 to 5 V as an example. A curve C1 indicates a gamma curve when the reference voltage VCOM is positive, and a curve C2 indicates a gamma curve when the reference voltage VCOM is negative.

Since the rail-to-rail type operational amplifier VOPR can operate at a voltage range between the voltage VDD and the voltage VSS, the rail-to-rail type operational amplifier VOPR can operate in the voltage range of 0 to 5 V in the case shown in FIG. 19. However, the operational range of the normal type operational amplifier VOP is smaller than the operational range of the operational amplifier VOPR. When the voltage VDD and the voltage VSS are respectively 5 V and 0 V, as shown in FIG. 19, the operational range of the normal type operational amplifier VOP is about 1 to 4 V, for example.

On the other hand, since the reference voltage generation circuit 20 according to this embodiment allows the operation target operational amplifier to be changed corresponding to the grayscale voltage, the reference voltage generation circuit 20 according to this embodiment can also deal with such a panel.

For example, when the reference voltage VCOM is positive as indicated by A1, the grayscale voltage GV0 is 5 V. In the reference voltage generation circuit 20, the grayscale voltage GV0 is the output from the rail-to-rail type operational amplifier VOPR, as shown in FIGS. 3 and 6. The rail-to-rail type operational amplifier VOPR operates even if the voltage of the input signal Vin is 5 V. Specifically, the reference voltage generation circuit 20 can output 5 V as the grayscale voltage GV0, as indicated by A1.

When the reference voltage VCOM is positive, the grayscale voltage GV1 is 4.5 V, as indicated by A2. In the reference voltage generation circuit 20, the grayscale voltage GV1 is set at the output from the impedance conversion circuit IP2, as shown in FIGS. 3 and 6. In the impedance conversion circuit IP2, the normal type operational amplifier VOP is turned OFF, and the rail-to-rail type operational amplifier VOPR is turned ON. The rail-to-rail type operational amplifier VOPR operates even when the voltage of the input signal Vin is 4.5 V, as described above. Specifically, the reference voltage generation circuit 20 can output 4.5 V as the grayscale voltage GV1, as indicated by A2.

When the reference voltage VCOM is positive, the grayscale voltage GV62 is 0.5 V, as indicated by A3. In the reference voltage generation circuit 20, the grayscale voltage GV1 is set at the output from the impedance conversion circuit IP2, as shown in FIGS. 3 and 6. In the impedance conversion circuit IP9, the normal type operational amplifier VOP is turned OFF, and the rail-to-rail type operational amplifier VOPR is turned ON. The rail-to-rail type operational amplifier VOPR operates even when the voltage of the input signal Vin is 0.5 V, as described above. Specifically, the reference voltage generation circuit 20 can output 0.5 V as the grayscale voltage GV62, as indicated by A3.

When the reference voltage VCOM is positive, the grayscale voltage GV63 is 0 V, as indicated by A4. In the reference voltage generation circuit 20, the grayscale voltage GV63 is set at the output from the rail-to-rail type operational amplifier VOPR, as shown in FIGS. 3 and 6. The rail-to-rail type operational amplifier VOPR operates even if the voltage of the input signal Vin is 0 V, as described above. Specifically, the reference voltage generation circuit 20 can output 0 V as the grayscale voltage GV63, as indicated by A4.

The above description also applies to the curve C2.

As described above, various panels can be gamma-corrected by turning ON/OFF the operational amplifiers VOP and VOPR of the impedance conversion circuits IP2, IP3, IP8, and IP9 corresponding to the gamma curve of the panel.

4. Effects of Reference Voltage Generation Circuit

Figure 20:
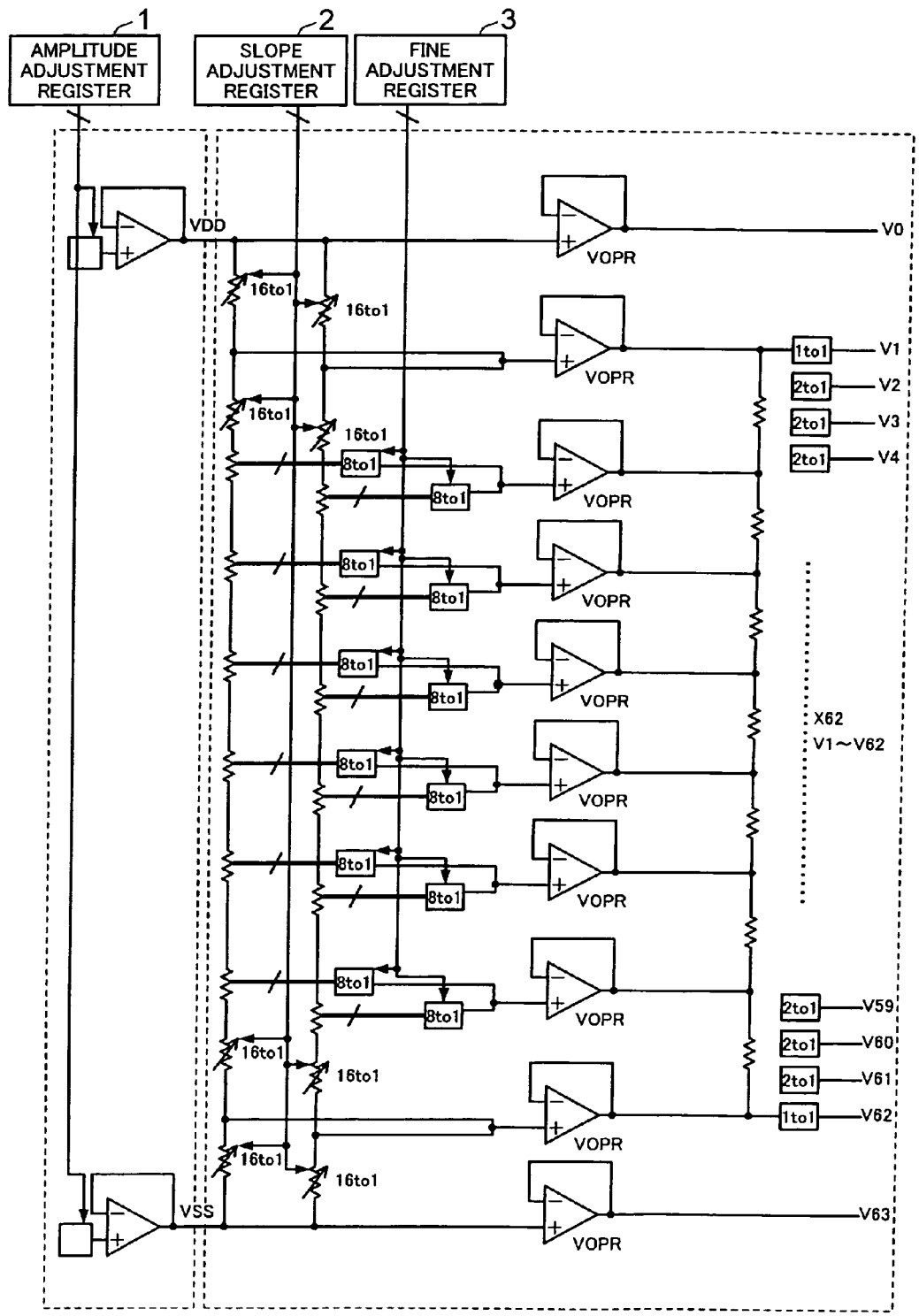
FIG. 20 is a configuration example of a comparative example according to one embodiment of the invention.

As shown in FIG. 20, a configuration may be employed in which all the operational amplifiers corresponding to the grayscale voltages GV0 to GV63 are formed by the rail-to-rail type operational amplifiers VOPR (hereinafter referred to as "comparative example"). According to this configuration, gamma correction can be performed for various panels in the same manner as the reference voltage generation circuit 20 according to this embodiment.

However, the power consumption of the rail-to-rail type operational amplifier VOPR is greater than that of the normal type operational amplifier VOP. As shown in FIG. 7, the number of current sources of the normal type operational amplifier VOP is two (current sources CSa and CSb). On the other hand, the number of current sources of the rail-to-rail type operational amplifier VOPR is four (current sources CS1 to CS4), as shown in FIGS. 11 and 12. Moreover, the circuit scale of the rail-to-rail type operational amplifier VOPR is greater than that of the normal type operational amplifier VOP. Therefore, the rail-to-rail type operational amplifier VOPR consumes a large amount of power in comparison with the normal type operational amplifier VOP. For example, the power consumption of the operational amplifier VOPR is 30 mA, and the power consumption of the operational amplifier VOP is 15 mA.

Specifically, since the comparative example uses a large number of operational amplifiers VOPR which consume a large amount of power, it is difficult to reduce power consumption. In particular, when the number of operational amplifiers VOPR must be increased along with an increase in the number of grayscales, power consumption is further increased.

In reference voltage generation circuit 20 according to this embodiment, since the normal type operational amplifier VOP and the rail-to-rail type operational amplifier VOPR are exclusively used in some impedance conversion circuits, power consumption can be reduced in comparison with the comparative example.

Figure 21:
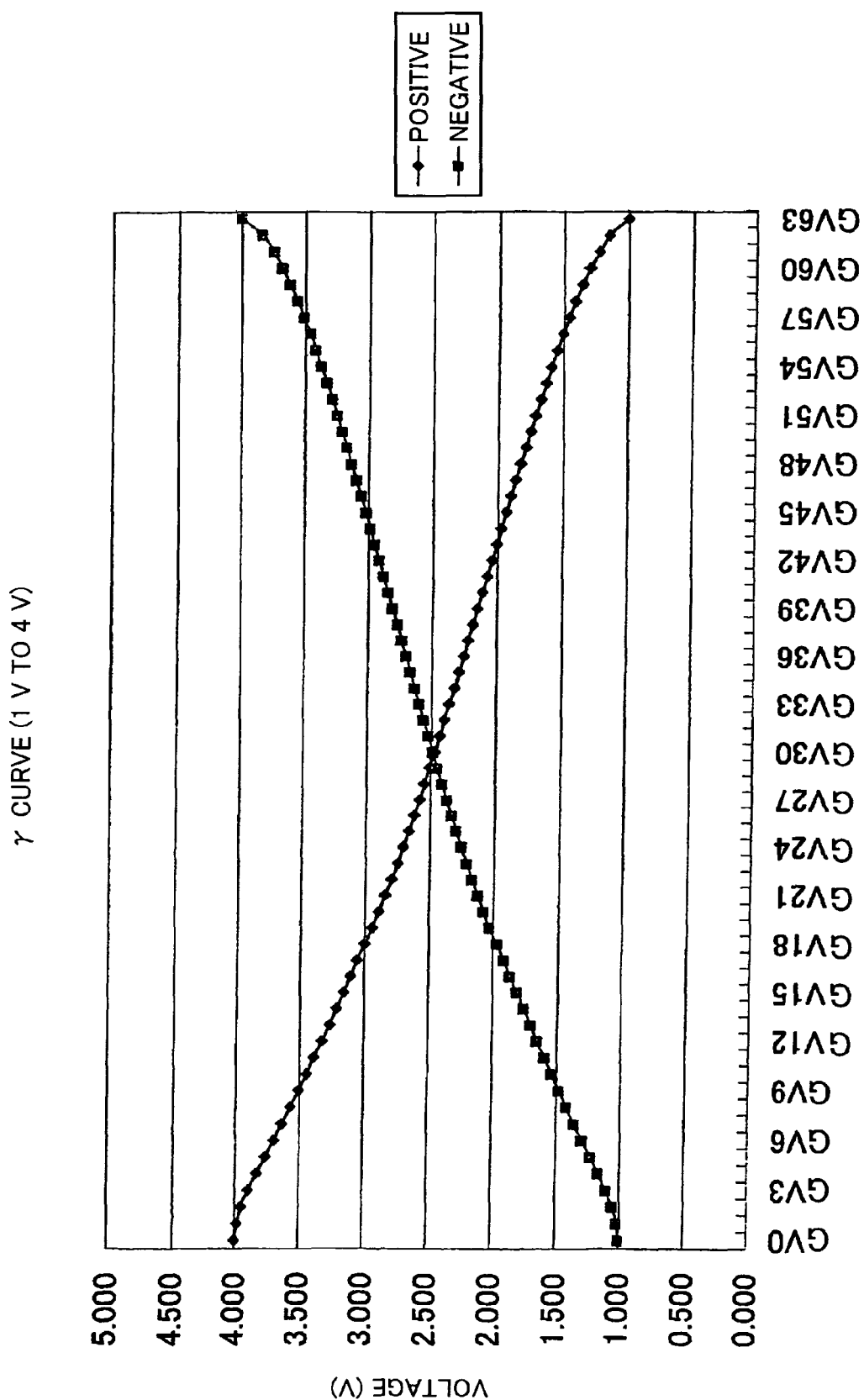
FIG. 21 is another diagram showing an example of a gamma curve.

Some panels may have display characteristics indicated by the gamma curve shown in FIG. 21. Since the grayscale voltage range of such a panel is 1 to 4 V, it is unnecessary to form all the operational amplifiers by the rail-to-rail type operational amplifiers VOPR, differing from the comparative example. Specifically, unnecessary power consumption occurs when applying the reference voltage generation circuit of the comparative example to such a panel.

In the reference voltage generation circuit 20 according to this embodiment, the rail-to-rail type operational amplifiers VOPR can be turned OFF in the impedance conversion circuits IP2, IP3, IP8, and IP9 when dealing with the gamma curve shown in FIG. 21. Therefore, power consumption can be reduced.

It is also possible to deal with the gamma curve shown in FIG. 21 by changing the combination of operational amplifiers to reduce power consumption. However, such panel specific design prevents a reduction in design cost.

On the other hand, the reference voltage generation circuit 20 according to this embodiment can deal with the gamma curve shown in FIG. 21 by turning OFF the rail-to-rail type operational amplifiers VOPR in the impedance conversion circuits IP2, IP3, IP8, and IP9. Therefore, it is possible to deal with the gamma curve shown in FIG. 21 while reducing power consumption. Specifically, since it is possible to deal with various panels without the need of panel specific design, the design cost can be reduced.

In other words, the normal type operational amplifier VOP is turned ON when the grayscale voltage required for the gamma curve can be compensated for by the normal type operational amplifier VOP, otherwise the rail-to-rail type operational amplifier VOPR is turned ON.

As described above, this embodiment enables the supply of optimum grayscale voltages for the panel display characteristics while reducing design cost and power consumption.

The above-described embodiment illustrates the case of applying the driver circuit according to the invention to an active matrix type liquid crystal device using TFTs. However, the invention is not limited thereto. For example, the driver circuit according to the invention may be applied to a liquid crystal device other than the active matrix type liquid crystal device, or may be applied to an electro-optical device such as an electroluminescent (EL) device, an organic EL device, or a plasma display device.

The configuration of the driver circuit is not limited to the configurations described with reference to FIGS. 5 to 19. Various configurations equivalent to these configurations may also be employed.

The invention may be applied not only to the scan line inversion drive, but also to the case of using other inversion drive methods.

The embodiments of the invention are described above in detail. Those skilled in the art would readily appreciate that various modifications are possible in the embodiments without materially departing from the novel teachings and the advantages of the invention. Accordingly, such modifications are intended to be included within the scope of the invention. Any term cited with a different term having a broader meaning or the same meaning at least once in the specification and the drawings can be replaced by the different term in any place in the specification and the drawings.

What is claimed is:

1. A voltage generation circuit comprising:
   a voltage divider circuit that generates first to Mth (M is an integer of two or more) divided voltages using a first power supply that supplies a first power supply voltage and a second power supply that supplies a second power supply voltage lower than the first power supply voltage, and outputs the generated first to Mth divided voltages; and
   first to Mth impedance conversion circuits that perform impedance conversion of the first to Mth divided voltages, each of the first to Pth (1<P<M, P is an integer) impedance conversion circuits and the Qth (P<Q<M, Q is an integer) to Mth impedance conversion circuits including an operational amplifier of a first type, that is a rail-to-rail type, of which an operational range is set in a range between the first power supply voltage and the second power supply voltage, and each of the (P+1)th to (Q−1)th impedance conversion circuits including an operational amplifier of a second type of which an operational range is set in a range between a third voltage that is lower than the first power supply voltage and a fourth voltage that is lower than the first power supply voltage and higher than the second power supply voltage,
      each of the second to Pth impedance conversion circuits and the Qth to (M−1)th impedance conversion circuits further including the operational amplifier of the second type, and
      the operational amplifier of the first type and the operational amplifier of the second type provided in each of the second to Pth impedance conversion circuits and the Qth to (M−1)th impedance conversion circuits being exclusively selected to output the voltage subjected to impedance conversion based on a value set in an initialization register for setting selection/unselection of the operational amplifier of the first type and the operational amplifier of the second type,
      each of the operational amplifier of the first type and the operational amplifier of the second type including a first conductivity type differential amplifier circuit that including:
         a first conductivity type first differential transistor pair, sources of the transistors being connected with the other end of a first current source to which the first power supply voltage is supplied at one end and an input signal and an output signal being respectively input to gates of the transistors, and a first current mirror circuit that generates drain currents of the transistors of the first differential transistor pair;
         a second conductivity type differential amplifier circuit that includes a second conductivity type second differential transistor pair, sources of the transistors being connected with the other end of a second current source to which the second power supply voltage is supplied at one end and the input signal and the output signal being respectively input to gates of the transistors, and a second current mirror circuit that generates drain currents of the transistors of the second differential transistor pair; and
         an output circuit that includes a second conductivity type first driver transistor of which gate voltage is controlled based on voltage of a first output node that is one of drains of the transistors of the first differential transistor pair, and a first conductivity type second driver transistor of which a drain is connected with a drain of the first driver transistor and of which gate voltage is controlled based on voltage of a second output node that is one of drains of the transistors of the second differential transistor pair, and outputs voltage of the drain of the first driver transistor as the output signal.

2. The voltage generation circuit as defined in claim 1,
   a bias current transistor being turned ON in the selected operational amplifier of the operational amplifier of the first type and the operational amplifier of the second type provided in each of the second to Pth impedance conversion circuits and the Qth to (M−1)th impedance conversion circuits, and a bias current transistor being turned OFF in the unselected operational amplifier.

3. The voltage generation circuit as defined in claim 1,
   each of the operational amplifier of the first type and the operational amplifier of the second type further including a first switch that electrically connects the gate of the transistor to which the input signal is input at the gate with the gate of the transistor to which the output signal is input at the gate, and
   the first switch being turned ON in the unselected operational amplifier of the operational amplifier of the first type and the operational amplifier of the second type, and the first switch being turned OFF in the selected operational amplifier.

4. The voltage generation circuit as defined in claim 1,
   each of the operational amplifier of the first type and the operational amplifier of the second type further including:
   a second switch that electrically connects the first output node and the second power supply; and
   a third switch that electrically connects the second output node and the first power supply,
      the second and third switches being turned ON in the unselected operational amplifier of the operational amplifier of the first type and the operational amplifier of the second type, and the second and third switches being turned OFF in the selected operational amplifier.

5. The voltage generation circuit as defined in claim 1,
   each of the operational amplifier of the first type and the operational amplifier of the second type further including a fourth switch that electrically connects the gate of the transistor to which the input signal is input at the gate with an output section from which the output signal is output, and the fourth switch being turned OFF in the unselected operational amplifier of the operational amplifier of the first type and the operational amplifier of the second type, and the fourth switch being turned ON in the selected operational amplifier.

6. The voltage generation circuit as defined in claim 1, each of the operational amplifier of the first type and the operational amplifier of the second type further including:
a fifth switch that electrically connects a middle node between the second driver transistor and the first driver transistor and the drain of the second driver transistor; and
a sixth switch that electrically connects the drain of the first driver transistor and the middle node,
the fifth and sixth switches being turned OFF in the unselected operational amplifier of the operational amplifier of the first type and the operational amplifier of the second type, and the fifth and sixth switches being turned ON in the selected operational amplifier.

7. The voltage generation circuit as defined in claim 1, each of the operational amplifier of the first type and the operational amplifier of the second type further including an output enable switch that electrically connects a middle node between the second driver transistor and the first driver transistor and an output section from which the output signal is output, and
the output enable switch being turned OFF in the unselected operational amplifier of the operational amplifier of the first type and the operational amplifier of the second type, and the output enable switch being turned ON in the selected operational amplifier.

8. The voltage generation circuit as defined in claim 1, the operational amplifier of the first type further including:
a first auxiliary circuit that drives at least one of the first output node and a first inversion output node that are the drains of the transistors of the first differential transistor pair based on the input signal and the output signal; and
a second auxiliary circuit that drives at least one of the second output node and a second inversion output node that are the drains of the transistors of the second differential transistor pair based on the input signal and the output signal.

9. The voltage generation circuit as defined in claim 8, when an absolute value of a gate-source voltage of the transistor of the first differential transistor pair to which the input signal is input at the gate is smaller than an absolute value of a threshold voltage of the transistor, the first auxiliary circuit controlling the gate voltage of the first driver transistor by driving at least one of the first output node and the first inversion output node, and
when an absolute value of a gate-source voltage of the transistor of the second differential transistor pair to which the input signal is input at the gate is smaller than an absolute value of a threshold voltage of the transistor, the second auxiliary circuit controlling the gate voltage of the second driver transistor by driving at least one of the second output node and the second inversion output node.

10. The voltage generation circuit as defined in claim 8, the first auxiliary circuit including:
first conductivity type first and second current driver transistors, the first power supply voltage being supplied to sources of the first and second current driver transistors and drains of the first and second current driver transistors being respectively connected with the first output node and the first inversion output node; and
a first current control circuit that controls gate voltages of the first and second current driver transistors based on the input signal and the output signal,
when an absolute value of a gate-source voltage of the transistor of the first differential transistor pair to which the input signal is input at the gate is smaller than an absolute value of a threshold voltage of the transistor, the first current control circuit controlling the gate voltages of the first and second current driver transistors so that at least one of the first output node and the first inversion output node is driven.

11. The voltage generation circuit as defined in claim 10, the first current control circuit including:
a third current source to which the second power supply voltage is supplied at one end;
a second conductivity type third differential transistor pair, sources of the transistors being connected with the other end of the third current source and the input signal and the output signal being respectively input to gates of the transistors; and
first conductivity type fifth and sixth current driver transistors, the first power supply voltage being supplied to sources of the fifth and sixth current driver transistors, drains of the fifth and sixth current driver transistors being respectively connected with the drains of the transistors of the third differential transistor pair, and a gate and the drain of each of the fifth and sixth current driver transistors being connected,
the drain of the transistor of the third differential transistor pair to which the input signal is input at the gate being connected with the gate of the second current driver transistor, and
the drain of the transistor of the third differential transistor pair to which the output signal is input at the gate being connected with the gate of the first current driver transistor.

12. The voltage generation circuit as defined in claim 10, operational amplifier of the first type further including:
a first auxiliary switch that electrically connects the gate of the first current driver transistor and the first power supply; and
a second auxiliary switch that electrically connects the gate of the second current driver transistor and the first power supply,
the first and second auxiliary switches being turned ON when the operational amplifier of the first type is not selected, and
the first and second auxiliary switches being turned OFF when the operational amplifier of the first type is selected.

13. The voltage generation circuit as defined in claim 8, the second auxiliary circuit including:
second conductivity type third and fourth current driver transistors, the second power supply voltage being supplied to sources of the third and fourth current driver transistors and drains of the third and fourth current driver transistors being respectively connected with the second output node and the second inversion output node; and
a second current control circuit that controls gate voltages of the third and fourth current driver transistors based on the input signal and the output signal; and signal, when an absolute value of a gate-source voltage of the transistor of the second differential transistor pair to which the input signal is input at the gate is smaller than an absolute value of a threshold voltage of the transistor, the second current control circuit controlling the gate voltages of the third and fourth current driver transistors so that at least one of the second output node and the second inversion output node is driven.

14. The voltage generation circuit as defined in claim 13, the second current control circuit including:
a fourth current source to which the first power supply voltage is supplied at one end;
a first conductivity type fourth differential transistor pair, sources of the transistors being connected with the other end of the fourth current source and the input signal and the output signal being respectively input to gates of the transistors; and
second conductivity type seventh and eighth current driver transistors, the second power supply voltage being supplied to sources of the seventh and eighth current driver transistors, drains of the seventh and eighth current driver transistors being respectively connected with the drains of the transistors of the fourth differential transistor pair, and a gate and the drain of each of the seventh and eighth current driver transistors being connected,
the drain of the transistor of the fourth differential transistor pair to which the input signal is input at the gate being connected with the gate of the fourth current driver transistor, and
the drain of the transistor of the fourth differential transistor pair to which the output signal is input at the gate being connected with the gate of the third current driver transistor.

15. The voltage generation circuit as defined in claim 13, the operational amplifier of the first type further including:
a third auxiliary switch that electrically connects the gate of the third current driver transistor and the second power supply; and
a fourth auxiliary switch that electrically connects the gate of the fourth current driver transistor and the second power supply,
the third and fourth auxiliary switches being turned ON when the operational amplifier of the first type is not selected, and
the third and fourth auxiliary switches being turned OFF when the operational amplifier of the first type is selected.

16. A voltage generation circuit comprising:
a voltage divider circuit that generates first to Mth (M is an integer of two or more) divided voltages using a first power supply that supplies a first power supply voltage and a second power supply that supplies a second power supply voltage lower than the first power supply voltage, and outputs the generated first to Mth divided voltages; and
first to Mth impedance conversion circuits that perform impedance conversion of the first to Mth divided voltages, each of the first to Pth (1<P<M, P is an integer) impedance conversion circuits and the Qth (P<Q<M, Q is an integer) to Mth impedance conversion circuits including an operational amplifier of a first type, that is a rail-to-rail type, of which an operational range is set in a range between the first power supply voltage and the second power supply voltage, and each of the (P+1)th to (Q−1)th impedance conversion circuits including an operational amplifier of a second type of which an operational range is set in a range between a third voltage that is lower than the first power supply voltage and a fourth voltage that is lower than the first power supply voltage and higher than the second power supply voltage,
the operational amplifier of the first type including:
a first conductivity type differential amplifier circuit that amplifies a difference between an input signal and an output signal;
a second conductivity type differential amplifier circuit that amplifies the difference between the input signal and the output signal;
a first auxiliary circuit that drives at least one of a first output node and a first inversion output node of the first conductivity type differential amplifier circuit based on the input signal and the output signal;
a second auxiliary circuit that drives at least one of a second output node and a second inversion output node of the second conductivity type differential amplifier circuit based on the input signal and the output signal; and
an output circuit that generates the output signal based on voltages of the first and second output nodes.

* * * * *